(12) United States Patent
Dötz et al.

(10) Patent No.: US 7,569,415 B2
(45) Date of Patent: Aug. 4, 2009

(54) LIQUID PHASE FABRICATION OF ACTIVE DEVICES INCLUDING ORGANIC SEMICONDUCTORS

(75) Inventors: Florian Dötz, Heidelberg (DE); Howard E. Katz, Owings Mills, MD (US); Jimmy Granstrom, Goleta, CA (US); Elsa Reichmanis, Westfield, NJ (US); Subramanian Vaidyanathan, New Providence, NJ (US); Ingolf Hennig, Neuluβheim (DE); Frauke Richter, Munich (DE)

(73) Assignees: Alcatel-Lucent USA Inc., Murray Hill, NJ (US); BASF Societas Europaea, Ludwigshafen (DE)

( * ) Notice: Subject to any disclaimer, the term of this patent is extended or adjusted under 35 U.S.C. 154(b) by 161 days.

(21) Appl. No.: 11/240,222

(22) Filed: Sep. 30, 2005

(65) Prior Publication Data
US 2007/0077681 A1    Apr. 5, 2007

(51) Int. Cl.
*H01L 51/40* (2006.01)
(52) U.S. Cl. ......................................................... 438/99
(58) Field of Classification Search .................. 438/99; 427/588
See application file for complete search history.

(56) References Cited

U.S. PATENT DOCUMENTS

| | | | |
|---|---|---|---|
| 6,265,243 B1 | 7/2001 | Katz et al. | 438/99 |
| 6,403,397 B1 | 6/2002 | Katz | 438/99 |
| 6,551,717 B2 | 4/2003 | Katz et al. | 428/447 |
| 6,803,262 B2 | 10/2004 | Wu et al. | 438/149 |
| 6,855,951 B2 | 2/2005 | Ong et al. | 257/40 |
| 6,890,868 B2 | 5/2005 | Wu et al. | 438/781 |
| 6,897,284 B2 | 5/2005 | Liu et al. | 528/373 |
| 2003/0059975 A1* | 3/2003 | Sirringhaus et al. | 438/99 |
| 2003/0227014 A1 | 12/2003 | Murti et al. | 257/40 |
| 2004/0132943 A1 | 7/2004 | Knoll et al. | 526/335 |
| 2004/0266207 A1 | 12/2004 | Sirringhaus et al. | 438/725 |
| 2005/0040394 A1 | 2/2005 | Wu et al. | 257/40 |
| 2005/0205861 A1 | 9/2005 | Bao et al. | 257/40 |

FOREIGN PATENT DOCUMENTS

| | | |
|---|---|---|
| DE | 103 40 643 A1 | 4/2005 |
| DE | 10343757 A1 | 4/2005 |
| JP | 2004165257 | 6/2004 |
| WO | WO 02/45184 A1 | 6/2002 |

(Continued)

OTHER PUBLICATIONS

Schroeder, et al., "Improving Organic Transistor Performance with Schottky Contacts", *Applied Physics Letters*, vol. 84, No. 6, pp. 1004-1005 (Feb. 9, 2004).

(Continued)

*Primary Examiner*—N Drew Richards
*Assistant Examiner*—Grant S Withers

(57) ABSTRACT

Techniques including steps of: providing a support body; forming an organic semiconductor composition body including an organic semiconductor composition on the support body, no more than 10% by weight of the organic semiconductor composition being pentacene; providing a first organic dielectric composition mobilized in a first liquid medium, the organic semiconductor composition being insoluble in the first liquid medium; and forming a first organic dielectric composition body from the first organic dielectric composition on the organic semiconductor composition body. Techniques in which an organic semiconductor composition body is formed on an organic dielectric composition body. Apparatus having an organic dielectric composition body on an organic semiconductor composition body.

22 Claims, 11 Drawing Sheets

FOREIGN PATENT DOCUMENTS

| WO | WO 03/052841 A1 | | 6/2003 |
|---|---|---|---|
| WO | WO 2004/057688 A1 | | 7/2004 |
| WO | WO2004/058740 A1 | | 7/2004 |
| WO | WO2006024012 | * | 8/2005 |

OTHER PUBLICATIONS

Yanagi, et al., "Comparative Carrier Transport Characteristics in Organic Field-Effect Transistors with Vapor-Deposited Thin Films and Epitaxially Grown Crystals of Biphenyl-Capped Thiophene Oligomers", *Adv. Funct. Mater.*, vol. 13, No. 10, pp. 767-773 (Oct. 2003).

Li et al., "Field-Effect Transistors Based on Thiophene Hexamer Analogues with Diminished Electron Donor Strength", *Chem. Mater.*, vol. 11, pp. 458-465 (1999).

Veres et al., "Low-κ Insulators as the Choice of Dielectrics in Organic Field-Effect Transistors", *Advanced Functional Materials*, vol. 13, No. 3, pp. 199-204 (Mar. 2003).

Mushrush et al., "Easily Processable Phenylene—Thiopene-Based Organic Field-Effect Transistors and Solution-Fabricated Nonvolatile Transistor Memory Elements", *J. Am. Chem. Soc.*, vol. 125, pp. 9414-9423 (2003).

Chabinyc et al., "Short channel effects in regioregular poly(thiophene) thin film transistors", *Journal of Applied Physics*, vol. 96, No. 4, pp. 2063-2070 (Aug. 15, 2004).

Arias et al., "All jet-printed polymer thin-film transistor active-matrix backplanes", *Applied Physics Letters*, vol. 85, No. 15., pp. 3304-3306 (Oct. 11, 2004).

Ong et al., "High-Performance Semiconducting Polythiophenes for Organic Thin-Film Transistors", *J. Am. Chem. Soc.*, vol. 126, pp. 3378-3379 (2004), plus supplementary materials (6 pgs).

Chabinyc et al., "Lamination Method for the Study of Interfaces in Polymeric Thin Film Transistors", *J. Am. Chem. Soc.*, vol. 126, pp. 13928-13929 (2004).

Zhao et al., "Microscopic Studies on Liquid Crystal Poly (3,3'''-dialkylquaterthiophene) Semiconductor" *Macromolecules*, vol. 37, pp. 8307-8312 (2004).

Salleo et al., "Intrinsic hole mobility and trapping in a regioregular poly(thiophene)", *Physical Review B*, vol. 70, pp. 115311-1 to 115311-10 (2004).

Ong et al., "Polythiophene-based field-effect transistors with enhanced air stability", *Synthetic Metals*, vol. 142, pp. 49-52 (2004).

Wu et al., "High-Performance Organic Thin-Film Transistors with Solution-Printed Gold Contacts", *Advanced Materials*, vol. 17, No. 2, pp. 184-187 (Jan. 31, 2005).

Li et al., "Novel Peripherally Substituted Indolo[3,2-*b*]carbazoles for High-Mobility Organic Thin-Film Transistors", *Advanced Materials*, vol. 17, No. 7, pp. 849-853 (Apr. 4, 2005).

Ong et al., "Structurally Ordered Polythiophene Nanoparticles for High-Performance Organic Thin-Film Transistors", *Advanced Materials*, vol. 17, pp. 1141-1144 (2005).

Wu et al., "Poly(3,3''-dialkylterthiophene)s: Room-Temperature, Solution-Processed, High-Mobility Semiconductors for Organic Thin-Film Transistors", *Chem. Mater.*, vol. 17, pp. 221-223 (2005), plus supporting information (2 pgs).

Locklin et al., "Organic Thin Film Transistors Based on Cyclohexyl-Substituted Organic Semiconductors", *Chem. Mater.*, vol. 17, pp. 3366-3374 (2005).

Wu et al., "Indolo[3,2-b]carbazole-Based Thin-Film Transistors with High Mobility and Stability", *J. Am. Chem. Soc.*, vol. 127, pp. 614-618 (2005).

Li et al., "Facile Synthesis of Silver Nanoparticles Useful for Fabrication of High-Conductivity Elements for Printed Electronics", *J. Am. Chem. Soc.*, vol. 127, pp. 3266-3267 (2005), plus supporting information (6 pgs).

Dötz et al., "Organic Semiconductors", Unpublished U.S. Appl. No. 11/241,642, filed Sep. 30, 2005 (49 pgs.).

Dötz te al., "Active Semiconductor Devices", Unpublished U.S. Appl. No. 11/240,298, filed Sep. 30, 2005 (40 pgs.).

Dötz et al., "Organic Compositions", Unpublished U.S. Appl. No. 11/240,733, filed Sep. 30, 2005 (49 pgs.).

* cited by examiner

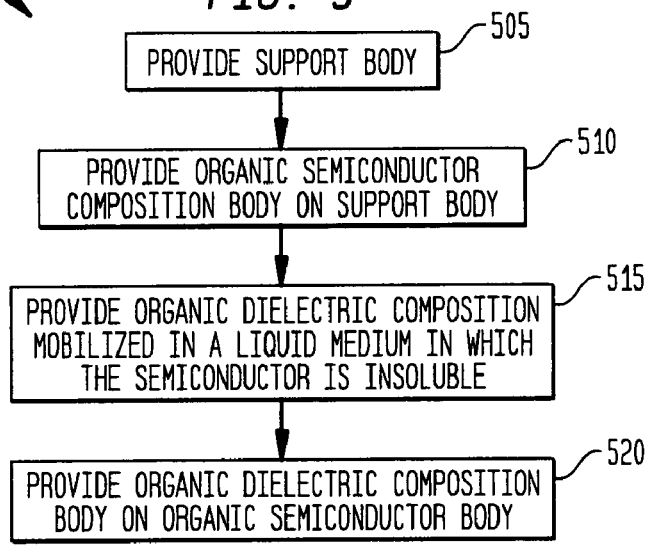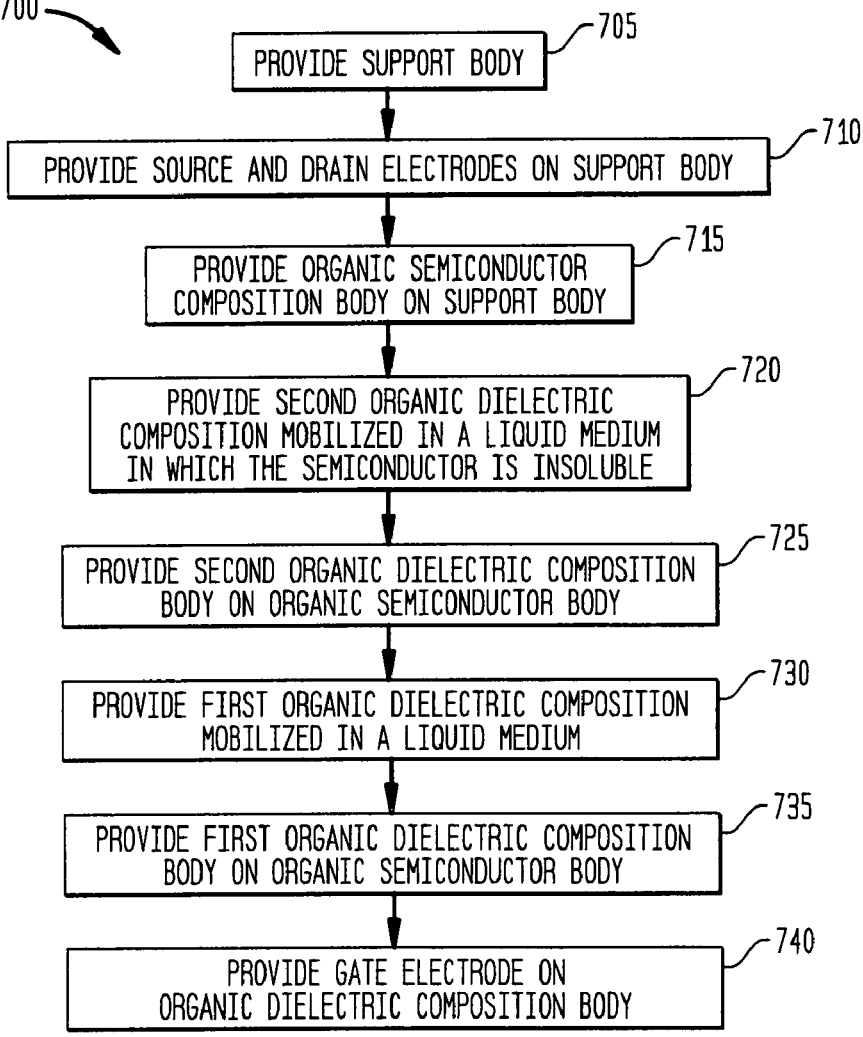

LIQUID PHASE FABRICATION OF ACTIVE DEVICES INCLUDING ORGANIC SEMICONDUCTORS

FIELD OF THE INVENTION

The present invention relates to the field of liquid phase processes for making devices including organic semiconductors, and the resulting devices.

BACKGROUND OF THE INVENTION

Organic electronics is an emerging field of technology which aims to realize low-cost and environmentally-friendly fabrication of electronic devices. Organic field effect transistors ("FETs") are potential alternatives to amorphous silicon transistors, and may be useful for instance in relatively low-speed devices with utility as pixel drivers of active matrix displays and in radio frequency identification devices. Potential advantages to making organic FETs instead of silicon- or other inorganic-based transistors include the possibilities of large-area and low-temperature processing, which may for example help enable fabrication of electronics on flexible plastic substrates.

Films of inorganic semiconductors are often brittle and inflexible, such that their fabrication into devices may be carried out on rigid silicon wafers yielding devices that themselves are inflexible. Films formed from organic semiconductors, in contrast, are often bendable and flexible, such that their fabrication into devices may potentially be carried out by a continuous process using, for example, a flexible web support body. The resulting devices themselves also have the potential to be bendable and flexible, opening up possible end use applications that are often impracticable for inorganic semiconductor-based devices.

Electronic devices having organic semiconductor films typically include a dielectric body that is adjacent and bonded to at least one face of the semiconductor film. Such a dielectric body may serve, for example, as a structural support for the semiconductor film, and as an electrical insulator for the semiconductor film to prevent shorting in the devices. In the case of an FET, the dielectric body also facilitates the high capacitance needed to induce charge carrier mobility in the source-drain channel. Desirably, such film and body elements are bonded together by the direct formation of one of such elements on the other. In order to carry out such formation, one of the elements is often deposited in vapor form on the other. For example, an organic semiconductor may be vaporized onto a pre-formed dielectric film web. However, carrying out such vaporization processes with sufficient precision to generate an organic semiconductor film of acceptable uniformity is difficult, particularly where the semiconductor film is continuously deposited onto a flexible web support in order to fabricate multiple active devices. In addition, vaporization often requires high temperatures which may cause degradation of the molecules of the organic semiconductor, and/or of the dielectric film contacted by the semiconductor vapor. Vaporization of precursors for making the dielectric film may similarly cause degradation of the molecules, oligomers or polymers used to form the dielectric film.

Accordingly, there is a need for new processes that permit the formation of a dielectric film in a liquid phase on an organic semiconductor, and new processes that permit the formation of an organic semiconductor film in a liquid phase on a dielectric film.

SUMMARY OF THE INVENTION

In one example of an implementation, a process is provided including the steps of: providing a support body; forming an organic semiconductor composition body including an organic semiconductor composition on said support body, no more than 10% by weight of said organic semiconductor composition being pentacene; providing a first organic dielectric composition mobilized in a first liquid medium, said organic semiconductor composition being insoluble in said first liquid medium; and forming a first organic dielectric composition body from said first organic dielectric composition on said organic semiconductor composition body.

In another implementation, a process is provided including the steps of: providing a support body; forming an organic dielectric composition body on said support body; providing an organic semiconductor composition mobilized in a liquid medium, the organic dielectric composition body being insoluble in said liquid medium; and forming an organic semiconductor composition body including said organic semiconductor composition on said organic dielectric composition body, no more than 10% by weight of said organic semiconductor composition being pentacene.

In a further implementation example, an apparatus is provided, including: a support body; an organic semiconductor composition body including an organic semiconductor on said support body, no more than 10% by weight of said organic semiconductor being pentacene, said organic semiconductor composition body being insoluble in a selected solvent; and a first organic dielectric composition body on said organic semiconductor composition body, said organic dielectric composition being soluble in said solvent.

A more complete understanding of the present invention, as well as other features and advantages of the invention, will be apparent from the following detailed description and the accompanying drawings.

BRIEF DESCRIPTION OF THE DRAWINGS

FIG. 5 shows an example of a process for fabrication of the laminate shown in FIG. 1;

FIG. 7 shows an example of a process for fabrication of the laminate shown in FIG. 6;

DETAILED DESCRIPTION

Figure 1:
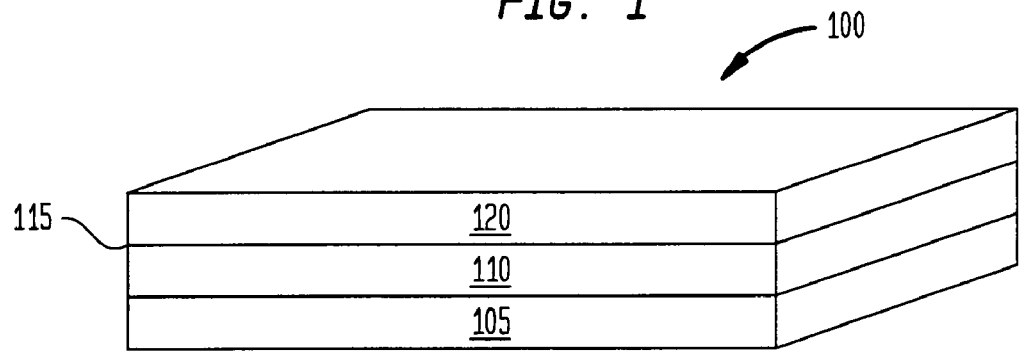
FIG. 1 shows a cross sectional perspective view of an example of a laminate having a support body having bonded thereon an organic semiconductor composition body and an organic dielectric composition body.

Examples will now be described more fully with reference to the accompanying drawings, in which several examples are shown. Various additional forms may be used, and this disclosure should not be construed as being limited to the examples of implementations set forth herein.

Processes are provided for the fabrication of active devices having an interface between a body formed from a soluble organic semiconductor composition and a body formed from a liquid phase including an organic dielectric composition. The interface may be formed while the organic dielectric composition is mobilized in a liquid phase in a liquid medium. The liquid medium for mobilizing the organic dielectric composition in a liquid phase may be selected such that adverse reactions with the soluble organic semiconductor during formation of the interface are minimized.

Further processes are provided for the fabrication of active devices having an interface between a body formed from a soluble organic dielectric composition and a body formed from a liquid phase including an organic semiconductor composition. The interface may be formed while the organic semiconductor composition is mobilized in a liquid phase in a liquid medium. The liquid medium for mobilizing the organic semiconductor composition in a liquid phase may be selected such that adverse reactions with the soluble organic dielectric composition during formation of the interface are minimized.

The liquid media may form, for example, a solution, dispersion, suspension, emulsion, gel, or micelles with the mobilized compositions. The resulting active devices incorporating the interfaces potentially have superior performance capabilities.

The ensuing discussion will be presented with reference to a liquid medium. However, it is understood that the liquid medium may include solid and gaseous components, and that the liquid medium may be in a vapor or gaseous form. In this regard, the term "liquid medium" means and includes a vaporized liquid medium.

The term "mobilized in a liquid medium" broadly means that the designated liquid medium causes a designated solid to take on properties of a liquid or vapor. For example, the solid may be dissolved in the liquid medium to form a single phase solution. Further for example, the solid may be dispersed in the liquid medium to form a two-phase dispersion. Additionally for example, the solid and the liquid medium may be combined together to form an emulsion, suspension, gel, or micelles. The liquid medium may include moisture, as well as gases. For example, where processing is carried out under an atmosphere including an elevated concentration of nitrogen, gaseous nitrogen may become dissolved in the liquid medium. Entrainment of gases into the liquid medium is to be avoided, however, to the extent that such gases will adversely affect the chemical or physical structure of the solid phase during or after fabrication of the interface between the bodies.

The term "solution" means that a substantial proportion of a designated solute has formed a single phase with a designated solvent; but a substantial solid, liquid and/or gaseous second phase that may include dispersed particulate matter may also be present. The term "soluble" means that a substantial proportion of a subject solute may form a single phase with a designated solvent; but a substantial second solid, liquid, and/or gaseous phase that may include dispersed particulate matter may also still be present.

The term "body" is defined as a solid formed of a designated composition such as an organic semiconductor composition or an organic dielectric composition. Residual liquid medium from the formation of such bodies, and moisture, for example, may be present. The body may take the form of, for example, a wafer, layer, sheet, or elongated web. An "elongated web" is a sheet having an elongated dimension that is substantially greater than a transverse dimension. An "elongated web" may, for example, be suitable for reel-to-reel continuous processing of a high surface area having a plurality of solid bodies on the elongated web. Any of such forms of solid bodies may be monolithic or multilaminar. For example, a layer may have multiple sub-layers; and an elongated web may have multiple elongated sub webs. A "body" may have a non-uniform thickness and other non-uniform dimensions, and does not have to be completely continuous. A "body" may include one or more bodies of the same material or different materials, which may or may not interpenetrate each other, and which bodies together are referred to as the "body". There is no particular limitation on the thickness or other dimensions of a body, although bodies desirably have dimensions that are optimized for their intended function. The term "laminate" is defined as two or more bodies that are bonded together.

The term "organic" broadly means that the designated composition includes molecules, oligomers, polymers, macromolecules, or other chemical or biological species (collectively "species"), in all cases having a carbon chain that is susceptible to heat-induced structural change, particularly degradation. The carbon chain may constitute a structural skeleton for such species, or merely a partial skeleton or peripheral moiety. An organic composition may include inorganic moieties, species, and elements.

FIG. 1 shows a cross-sectional perspective view of an example of an implementation of a laminate 100 having a support body 105 having bonded thereon an organic semiconductor composition body 110. The organic semiconductor composition body 110 forms an interface 115 with an organic dielectric composition body 120 bonded to the semiconductor composition body 110. The organic semiconductor composition body 110 is interposed between the support body 105 and the organic dielectric composition body 120. The laminate 100 may for example be fabricated by first providing the organic semiconductor composition body 110 on the support body 105, and then providing the organic dielectric composition body 120 to form the interface 115 with the organic semiconductor composition body 110.

In this example, the organic semiconductor composition body 110 may be fabricated on the support body 105 from either a liquid or vapor phase, as the composition of the support body 105 may readily be selected from a broad range of potential materials so as not to adversely react with the organic semiconductor composition body 110 being formed.

The organic dielectric composition body 120 may be fabricated from an organic dielectric composition mobilized in a liquid medium. Deposition of the organic dielectric composition in a form mobilized in a liquid medium is carried out in a manner such that mutual compatibility between the liquid medium for mobilizing the organic semiconductor composition body 110 and the liquid medium for mobilizing the organic dielectric composition body 120 is provided both during and after their fabrication. By "mutual compatibility" is meant that the application of the organic dielectric composition in its liquid medium onto the previously formed organic semiconductor composition body 110 does not cause any substantial adverse physical or chemical reaction on or in the organic semiconductor composition body 110. In particular, the liquid medium for the organic dielectric composition is selected so that the organic dielectric composition may be adequately mobilized for liquid phase deposition on the organic semiconductor composition body 110, substantially without mobilizing or adversely reacting with the organic semiconductor composition. By "adversely reacting" in this regard in the present specification is meant chemical or physical reaction with, doping into or leaching out of the organic semiconductor composition. Such chemical reactions could otherwise adversely affect the performance properties of the organic semiconductor composition body 110 to a substantial degree. By "mobilizing the organic semiconductor composition body 110" in the present specification is meant dissolving, delaminating, swelling, or otherwise physically disturbing the organic semiconductor composition body 110 to a substantial degree. In this manner, the integrity and desired surface functionality of the organic semiconductor composition body 110 are maintained at the interface 115. In an example of a FET fabricated to incorporate the laminate 100, source and drain electrodes may be formed at the interface 115, and a channel region for passage of charge carriers between source and drain electrodes is then also formed at the interface 115. Disturbance of the organic semiconductor composition body 110 at the interface 115 may degrade the performance of the FET. The organic semiconductor composition is not substantially dissolved by the liquid medium for the organic dielectric composition. Further, the liquid medium does not react with or otherwise chemically modify the organic semiconductor composition in a manner having a substantial adverse effect on the desired performance properties of the organic semiconductor composition body 110. In addition, the organic dielectric composition body 120 as formed does not incur a substantial adverse reaction caused by the organic semiconductor composition body 110. For example, if the organic dielectric composition as mobilized in the liquid medium were to leach substantial conductive moieties out from the organic semiconductor composition body 110, the dielectric performance of the organic dielectric composition body 120 could be degraded. In one example, the organic dielectric composition is soluble in water; and the organic semiconductor composition is substantially insoluble in water but is soluble in a different solvent.

The support body 105 may generally be formed from any material suitable for providing structural support directly to the organic semiconductor composition body 110 and indirectly to the organic dielectric composition body 120. The support body 105 may be rigid or flexible as needed for compatibility with the process for fabricating the laminate 100 and for compatibility with its intended end-use. In one example, the support body 105 is an elongated web formed of aluminum, a glass, or a polymer. Suitable polymers for this purpose include, for example, poly(ethylene terephthalate) generally referred to as PET (such as MYLAR®V commercially available from E.I. du Pont de Nemours & Company or Melinex® available from Du Pont Teijin Films), polyethylene naphthalate ("PEN"), poly(ethylene terephthalate)-poly(ethylene naphthalate) copolymer ("PET/PEN"), and polyimides (such as Kapton® also commercially available from E.I. du Pont de Nemours & Company).

The organic semiconductor composition includes one or more soluble organic semiconductors. The term "soluble" as applied to the organic semiconductor composition means that a substantial proportion of the organic semiconductor composition may form a single phase with a solvent that is also a suitable solvent for an organic dielectric composition, although a substantial additional solid, liquid, and/or gaseous phase may also still be present. Organic semiconductors that do not satisfy this definition of solubility may further be present, provided that they constitute a minor proportion of the organic semiconductor composition. Inorganic moieties, species, and elements may also be included in the organic semiconductor composition. In sum, (1) there exists at least one suitable solvent for the selected organic dielectric composition in which the organic semiconductor composition is also soluble; and (2) there further exists at least one suitable solvent for the selected organic dielectric composition, in which the organic semiconductor composition is not soluble.

In one example, a selected organic semiconductor composition is soluble in a moderately polar or polarizable solvent including an aromatic ring and/or having a dipole moment within a range of between about 1 debye and about 3 debye. In another example, such a moderately polar or polarizable solvent is substantially devoid of free hydroxyl moieties. In a further example, a selected organic semiconductor composition is soluble in a solvent such as methylene chloride, chlorobenzene, toluene, xylene, chloroform, tetrahydrofuran, cyclohexanol, and mixtures.

Pentacene exhibits broad-based poor solubility in many common solvents. In this regard, "pentacene" means pentacene that has not been derivatized in order to increase its solubility. This poor solubility could be strategically used in making a laminate 100 in which the organic semiconductor composition body 110 included pentacene. For example, where the organic semiconductor composition body 110 included a substantial proportion of pentacene, one or more among many suitable liquid media could be selected to mobilize an organic dielectric composition for formation of an organic dielectric composition body 120 bonded to a body 110. However, in examples where the organic semiconductor composition body 110 does not include a substantial proportion of pentacene, these advantages inherent in the poor solubility of pentacene are not strategically available. The organic semiconductor composition employed in all examples herein includes no more than ten percent (10%) by weight of pentacene as a fraction of the total weight of the organic semiconductor included in the organic semiconductor composition. Hence, the weight of non-pentacene organic semiconductors in the organic semiconductor compositions constitutes at least ninety percent (90%) by weight of the organic semiconductors.

Subject to the foregoing solubility requirement, suitable organic semiconductors may, as examples, include poly(9,9'-dioctylfluorene-co-bithiophene) ("F8T2"), 6,13-bis(triisopropylsilylethynyl)pentacene ("TIPS"), 5,5'-bis(4-(1-methylhexyloxy)phenyl)-2,2'-bithiophene ("1-MH-PTTP"), and 5,5'-bis(4-hexylphenyl)-2,2'-bithiophene ("6PTTP6").

Information for synthesis of 6PTTP6 is available in Mushrush, M., Facchetti, A., Lefenfeld, M., Katz, H. E., and Marks T. J., "Easily processable phenylene-thiophene-based organic field-effect transistors and solution-fabricated nonvolatile transistor memory elements", *J. Am. Chem. Soc.*, vol. 125, pp. 9414-9423 (2003), which is hereby incorporated herein by reference in its entirety. Further thiophene compositions that may be suitable include: 2,5-linked thiophene tetramers and pentamers substituted at the terminal 5 positions with linear alkyl or alkoxyalkyl chains of about 4 to about 12 atoms in length; regioregular poly (3-hexylthiophene); and co-oligomers of 2,5-linked thiophene rings and 1,4-linked benzene rings about 5 rings long, substituted in the same manner as described above for the thiophene oligomers, including for example 1,4-bis(5-(5-hexylthien-2-yl)thien-2-yl)benzene (DHT4Ph). DHT4Ph can, e.g., be synthesized according to procedures described for hexylated 5- and 6-ring compositions in W. Li et al., Chem. Mater., Vol. 11, pp. 458 et seq. (1999), hereby incorporated in its entirety by reference, using 1,4-diiodobenzene as the source of the benzene ring. In addition, naphthalene-N,N-dialkyl-1,4,5,8-tetracarboxylic diimide compositions may be suitable for use in the organic semiconductor composition. Further, poly(3,3"-dioctylterthiophene) ("PTT-8") and derivatives may be used. In addition, poly(3,3'''-dodecylquaterthiophene) ("PQT-12"), having the following molecular structure, may be used:

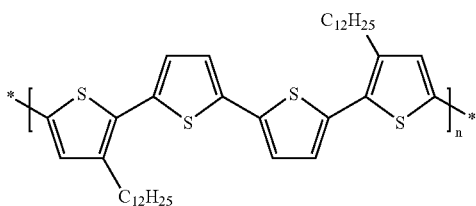

It is to be understood that the foregoing classes and species of semiconductors may be used, if available, in monomeric, oligomeric, and polymeric forms, provided however in each case that they must be soluble as that term is defined herein.

PTT-8 and its derivatives may be synthesized according to procedures disclosed in B. S. Ong et al., "Poly(3,3"-dialkyl-terthiophene)s: Room-Temperature, Solution-Processed, High-Mobility Semiconductors for Organic Thin-Film Transistors", Chem. Mater. Vol. 17, pp. 221-223 (2005), the entirety of which is hereby incorporated herein by reference.

Synthesis of 5,5'-Bis-[4-(1-methyl-hexyloxy)-phenyl]-[2,2']bithiophene (1-MH-PTTP) may be carried out, for example, by the following three steps.

Step 1. Synthesis of
1-Bromo-4-(1-methyl-hexyloxy)-benzene

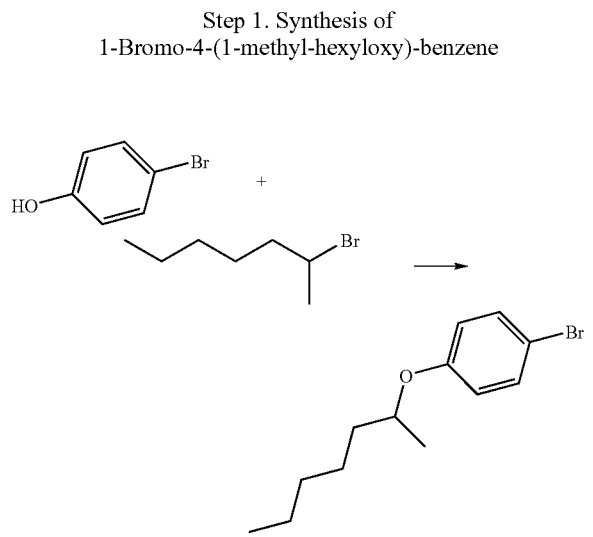

p-Bromophenol (295.52 grams ("g"), 1500.00 millimole) is dissolved in anhydrous dimethyl formamide ("DMF") (500 milliliters) in a 2000 milliliter ("mL") 3-necked flask equipped with mechanical stirrer and condenser, under an argon atmosphere. To this solution, (1-methyl)hexylbromide (322.38 grams, 1800.00 millimoles), sodium iodide (33.57 g, 225.00 mmol) and anhydrous potassium carbonate (621.95 g, 4500.00 mmol) are added. The resulting suspension is heated to 100° C. and stirred at that temperature for 72 hours. After cooling to room temperature, water (1000 mL) and n-hexane (300 mL) are added. The aqueous layer is separated and extracted with n-hexane (3×100 mL). The combined organic layers are washed with diluted sodium chloride solution (2×100 mL) and dried ($MgSO_4$). The solvent is removed by rotary evaporation under reduced pressure and the residue is filtered using a $SiO_2$ layer (10×10 cm) and n-hexane as eluent. After removal of solvent by rotary evaporation and in vacuo a colorless liquid (245.54 g, 60%) is obtained.

Step 2. Synthesis of
2-[4-(1-Methyl-hexyloxy)-phenyl]-thiophene

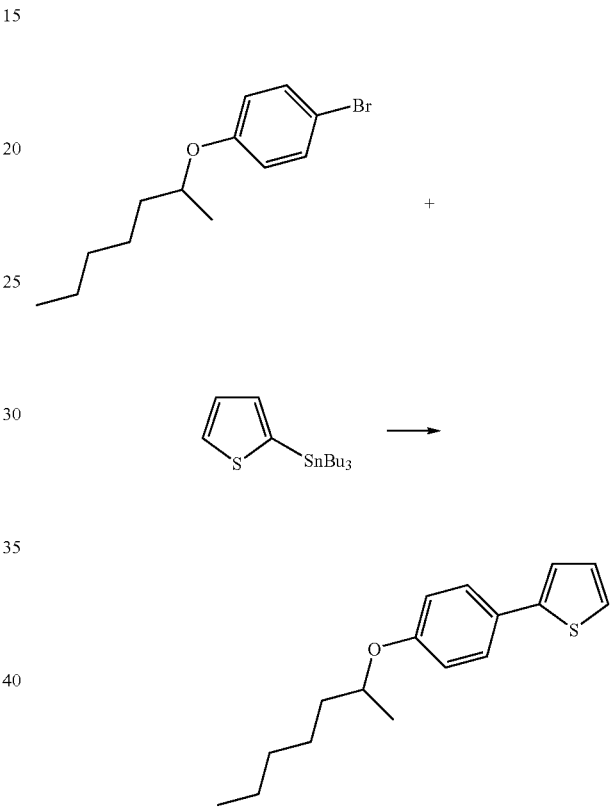

Tetrakistriphenylphosphinpalladium(0), (20.45 g, 17.70 mmol) is suspended in anhydrous DMF (400 mL) in a 2000 mL 3-necked flask with magnetic stirrer and condenser under an argon atmosphere. To this, 1-bromo-4-(1-methyl-hexyloxy)-benzene (240.00 g, 884.96 mmol) and tri-n-butylstannylthiophene (330.24 g, 884.96 mmol) are added. The resulting solution is stirred at 100° C. for 68 hours. After cooling to room temperature the mixture is poured into water (2000 mL) and divided into two portions of the same volume. Extraction with n-hexane (3×300 mL) results in two layers and an emulsion between those two layers. The organic layers are separated, combined, washed with diluted sodium chloride solution (2×400 mL) and dried ($MgSO_4$). After removal of solvent by rotary evaporation most of the byproducts are removed by distillation ($p=10^{-3}$ millibar, maximum temperature $T_{max}=130°$ C.). The residue is subjected to filtration using a layer of $SiO_2$ (30×10 cm) and n-hexane as eluent. After removal of solvent, a yellowish oil (107.88 g, about 44%) with sufficient purity for synthetic purposes is obtained.

Step 3. Synthesis of 5,5'-Bis-[4-(1-methyl-hexyloxy)-phenyl]-[2,2']bithiophene (1-MH-PTTP)

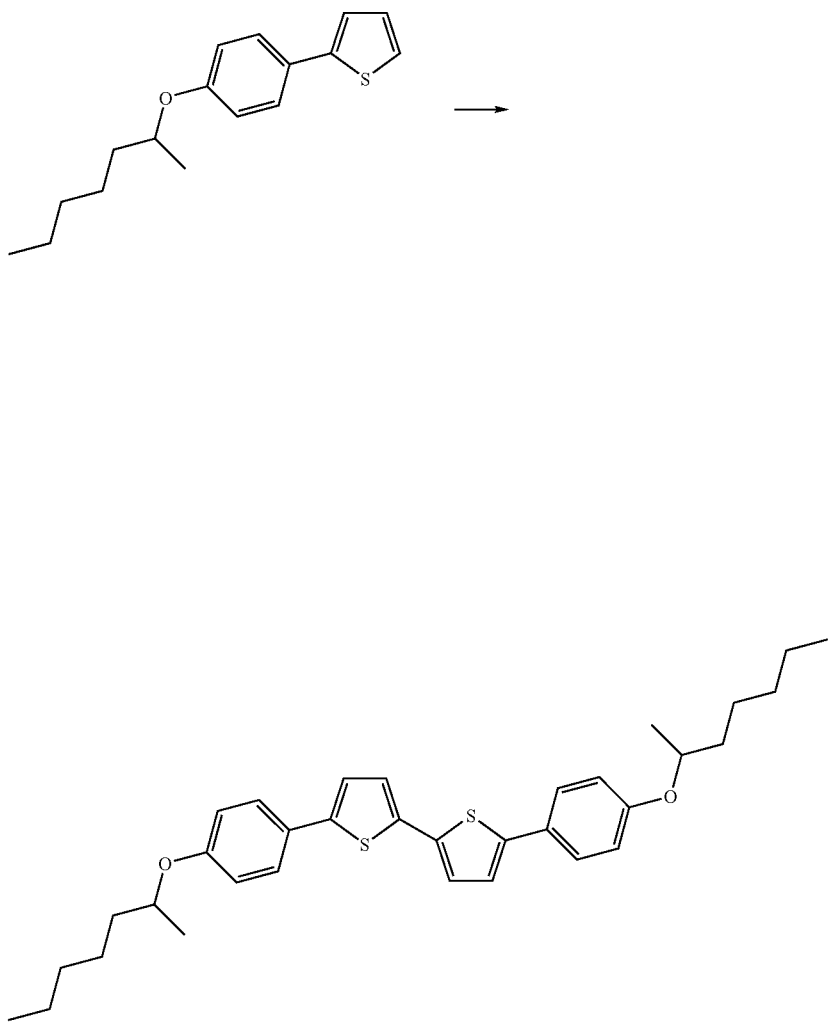

In a 2000 mL 3-necked flask equipped with mechanical stirrer, condenser and dropping funnel, 2-[4-(1-Methyl-hexyloxy)-phenyl]-thiophene (26.00 g, 94.74 mmol) is dissolved in anhydrous tetrahydrofuran ("THF") (250 mL) under an argon atmosphere. Then n-BuLi (2.5M in hexanes, 41.68 mL, 104.22 mmol) is added at −70° C. within about 15 min by a syringe. The solution is stirred for 1 h at that temperature. A solution of tris-(2,4-pentadionato)-iron(III) (33.48 g, 94.74 mmol) in anhydrous THF (400 mL) is transferred to the dropping funnel under an argon atmosphere and added to the lithiated 2-[4-(1-Methyl-hexyloxy)-phenyl]-thiophene at −70° C. within about 45 min. The mixture is then allowed to warm to room temperature and heated to reflux for 1 h. After cooling the solvents are removed by rotary evaporation under reduced pressure. The residue is transferred to an extraction thimble and extracted with MeOH (900 mL) overnight using a Soxhlet-apparatus to remove most of the iron compounds. The deep orange colored extract is discarded and the thimble is dried in a continuous stream of nitrogen. The extraction is continued to completeness using n-hexane (900 mL). From the extract the product precipitates upon cooling as a pale orange solid. After separation of the solid by filtration using a folded filter and drying, it is extracted a second time using methanol (900 mL) for about 2 h until the extract is pale yellow. The methanolic solution is discarded and the thimble is dried as described above. Complete extraction using n-hexane (900 mL) and cooling of the resulting solution yields the pure product as a bright yellow solid (10.78 g, 42%).

Further organic semiconductors that may be suitable are shown in Table 1.

TABLE 1

| Short Name | Molecular Structure | Example Synthesis Routes S = synthetic procedure; P = purification; and Y = yield. | Formulation and processing (solubility, viscosity of formulation, deposition on substrate, film quality) |
|---|---|---|---|
| 6-PTTP-6 | Molecular Weight = 486.79<br>Exact Mass = 486<br>Molecular Formula = C32H38S2<br>Molecular Composition = C 78.96% H 7.87% S 13.17%<br>5,5'-bis(4-hexyl phenyl)-2,2'-bithiophene | S: MUSHRUSH<br>P: crystallisation<br>Y: 50%<br>large scale possible | sparingly soluble in o-xylene, in THF about 9500 ppm); viscosity η = 11 mPas at concentration = 200 ppm, (cyclohexanol/Tetrahydrofurfurylalcohol (THFA).]THF = 72:18:10)<br>Melting point ("mp") = 228° C. and 233° C. |
| 8-PTTP-8 | Molecular Weight = 542.90<br>Exact Mass = 542<br>Molecular Formula = C36H46S2<br>Molecular Composition = C 79.65% H 8.54% S 11.81%<br>5,5'-bis(4-octyl phenyl)-2,2'-bithiophene | S: MUSHRUSH<br>P: crystallisation<br>Y: 57%<br>large scale possible | |
| 6-O-PTTP-O-6 | Molecular Weight = 518.79<br>Exact Mass = 518<br>Molecular Formula = C32H38O2S2<br>Molecular Composition = C 74.09% H 7.38% O 6.17% S 12.36%<br>5,5'-bis(4-hexyloxy phenyl)-2,2'-bithiophene | S: route A, FIG. 2<br>P: repeated crystallisation<br>Y: 25%<br>heavy loss during P | solubility in THF about 600 ppm, lowest value by far. Differential scanning calorimetry ("DSC"); melting point = 243° C., smaller transitions at 65, 148, 176, 255, 261° C. (doastereomers or LC) |
| 5(4Me)-O-PTTP-O-5(4Me) | Molecular Weight = 518.79<br>Exact Mass = 518<br>Molecular Formula = C32H38O2S2<br>Molecular Composition = C 74.09% H 7.38% O 6.17% S 12.36%<br>5,5'-bis(4-(4-methylpentyloxy)phenyl)-2,2'-bithiophene | S: route A, FIG. 2<br>P: repeated crystallisation<br>Y: 31%<br>heavy loss during P | |

TABLE 1-continued

Figure 2:
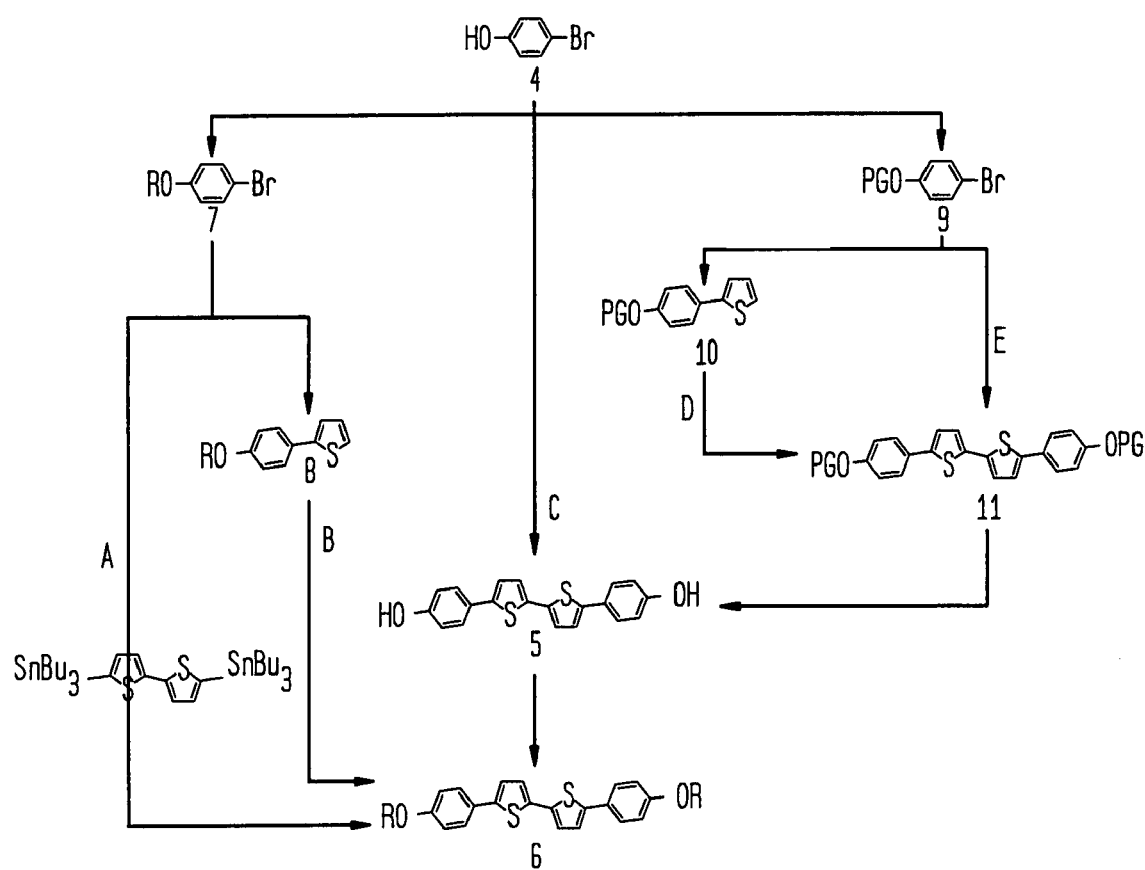
FIG. 2 shows synthesis scheme 1 routes A, B, C, and D as designated in Table 1.

| Short Name | Molecular Structure | Example Synthesis Routes<br>S = synthetic procedure;<br>P = purification; and<br>Y = yield. | Formulation and processing (solubility, viscosity of formulation, deposition on substrate, film quality) |
|---|---|---|---|
| 8(3,7Me)-O-PTTP-O-8(3,7Me) | Molecular Weight = 631.00<br>Exact Mass = 630<br>Molecular Formula = C40H54O2S2<br>Molecular Composition = C 76.14% H 8.63% O 5.07% S 1.16%<br>5,5'-bis(4-(3,7-dimethyloctyloxy)phenyl)-2,2'-bithiophene | S: route A, FIG. 2<br>P: repeated crystallization<br>Y: 15%<br>heavy loss durin P | solubility in THF about 12,000 ppm<br>DCS: mp = 192° C., smaller transition at 143° C. (diastereomer or LC) |
| 8(3S,7Me)-O-PTTP-P-8(3S,7Me) | 5,5=—bis(4-(3S,7-dimethylcotyloxy)phenyl)-2,2'-bithiophene<br>Molecular Weight = 631.00<br>Exact Mass = 630<br>Molecular Formula = C40H54O2S2<br>Molecular Composition = C 76.14% H 6.63% O 5.07% S 10.16% | S: route B, FIG 2<br>P: extraction<br>Y: 63%, optically pure | |

TABLE 1-continued

| Short Name | Molecular Structure | Example Synthesis Routes<br>S = synthetic procedure;<br>P = purification; and<br>Y = yield. | Formulation and processing (solubility, viscosity of formulation, deposition on substrate, film quality) |
|---|---|---|---|
| 4(2Et)-O-PTTP-O-4(2Et) | Molecular Weight = 518.79<br>Exact Mass = 518<br>Molecular Formula = C32H38O2S2<br>Molecular Composition = C 74.09% H 7.38% O 6.17% S 12.36%<br>5,5′-bis(4-(2-ethylbutyloxyphenyl)-2,2′-bithiophene | S: route B, FIG. 2<br>P: precipitation, extraction<br>Y: 37% | solubility in THF about 4,900 ppm |
| 6(2Me)-O-PTTP-O-6(2Me) | Molecular Weight = 546.84<br>Exact Mass = 546<br>Molecular Formula = C34H42O2S2<br>Molecular Composition = C 74.68% H 7.74% O 5.85% S 11.73%<br>5,5′-bis(4-(2-methylhexyloxyphenyl)-2,2′-bithiophene | S: route B, FIG. 2<br>P: extraction<br>Y: 47% | sufficiently soluble in THF (about 61,000 ppm)<br>DSC: mp = 197° C. |

TABLE 1-continued

| Short Name | Molecular Structure | Example Synthesis Routes<br>S = synthetic procedure;<br>P = purification; and<br>Y = yield. | Formulation and processing<br>(solubility, viscosity of formulation, deposition on substrate, film quality) |
|---|---|---|---|
| 6(2Et)-O-PTTP-O-6(2Et) | 5,5'-bis(4-(2-ethylhexyloxy)phenyl)-2,2'-bithiophene<br><br>Molecular Weight = 574.89<br>Exact Mass = 574<br>Molecular Formula = C36H46O2S2<br>Molecular Composition = C 75.21% H 8.07% H 6.07% O 5.57% S 11.15% | S: route A, FIG. 2<br>P: chromatography<br>Y: 5%<br>heavy loss during P<br>S: route B<br>P: precipitation<br>Y: 29 and 26% | sufficiently soluble in THF (about 70,000 ppm) and o-xylene (about 25,000 ppm); viscosity η = 22 mPa·s at c = 500 ppm, cyclohexanol/THFA/THF = 86:9:5<br>DSC: mp = 148° C., smaller transition between 75° C. and 105° C. (only in heating cycle) |
| 6(1Me)-O-PTTP-O-6(1Me); also referred to as 1-MH-PTTP | 5,5'-bis(4-(1-methylhexyloxy)phenyl)-2,2'-bithiophene<br><br>Molecular Weight = 546.84<br>Exact Mass = 546<br>Molecular Formula = C34H42O2S2<br>Molecular Composition = C 74.68% H 7.74% O 5.85% S 11.73%<br>S: route D, FIG 2<br>P: filtration (SiO2),<br>Y: 19<br>S: route B, FIG. 2<br>P: extraction<br>Y: 52, 37, 51 and 44%<br>S: route B, FIG. 2<br>P: 2 x precipitation.<br>from toluene with methanol<br>Y: 39% | well soluble in THF (about 89,000 ppm); o-xylene 54,000 ppm;<br>THF/cyclohexanol 2:8 (viscosity 9 mPas)<br>4,000 ppm<br>2-Ethylhexanol: about 800 ppm<br>DSC: mp = 143° C., smaller transition at 118° C., 129° C., and 132° C. | |

TABLE 1-continued

Figure 3:
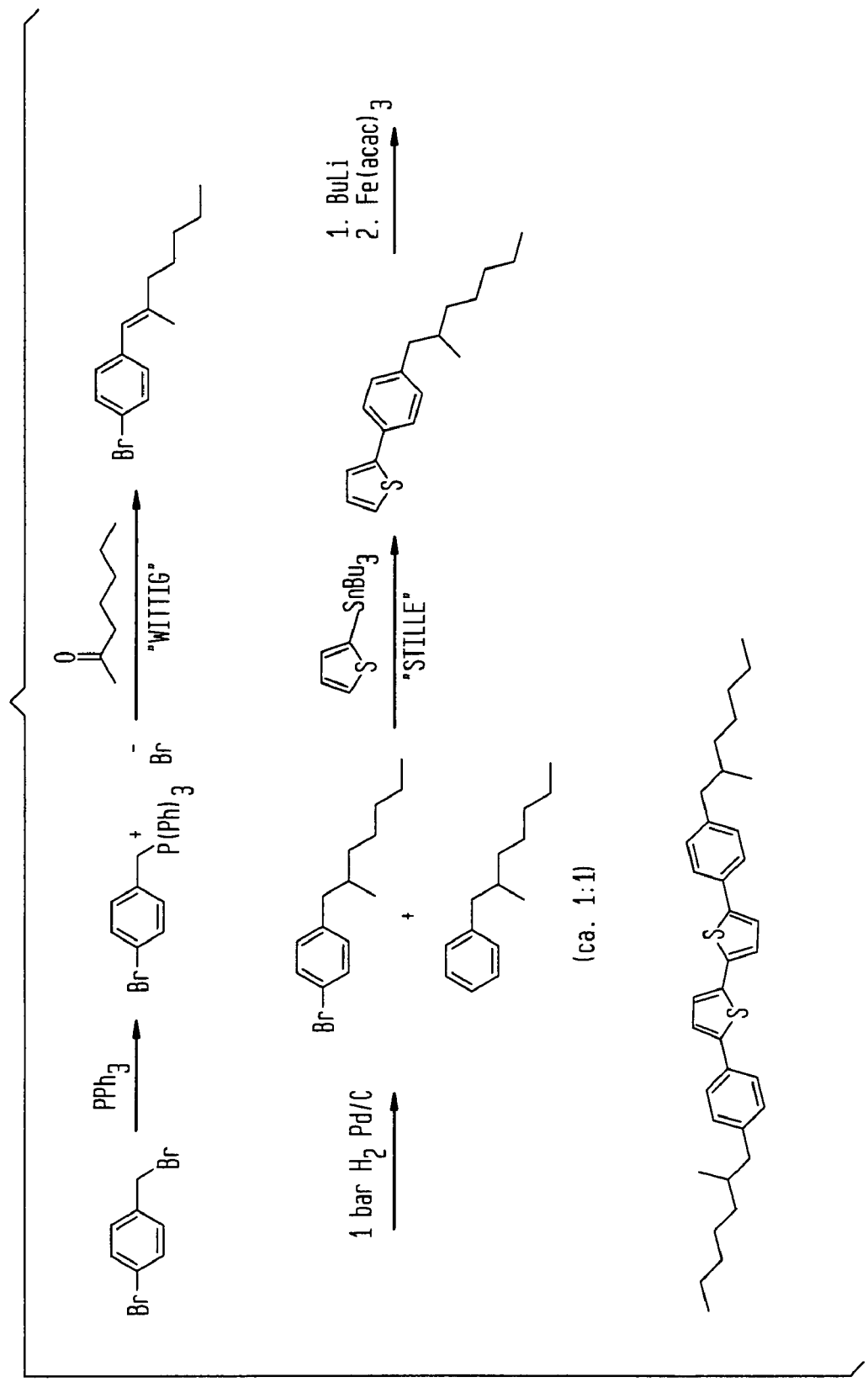
FIG. 3 shows synthesis scheme 2 as designated in Table 1.

| Short Name | Molecular Structure | Example Synthesis Routes S = synthetic procedure; P = purification; and Y = yield. | Formulation and processing (solubility, viscosity of formulation, deposition on substrate, film quality) |
|---|---|---|---|
| 7(2Me)-PTTP-7(2Me) | Molecular Weight = 542.90<br>Exact Mass = 542<br>Molecular Formula = C36H46S2<br>Molecular Composition = C 79.65% H 8.54% S 11.81%<br>5,5'-bis(4-(2-methylheptyl)phenyl)-2,2'-bithiophene | S: FIG. 3<br>P: extraction<br>Y: 54%. | well soluble in THF, but not better than oxygen-containing analogue "6(1Me)-O" (about 45,000 ppm) |

TABLE 1-continued

| Short Name | Molecular Structure | Example Synthesis Routes<br>S = synthetic procedure;<br>P = purification; and<br>Y = yield. | Formulation and processing (solubility, viscosity of formulation, deposition on substrate, film quality) |
|---|---|---|---|
| 6(1Me)-PTTP-6(1Me) | 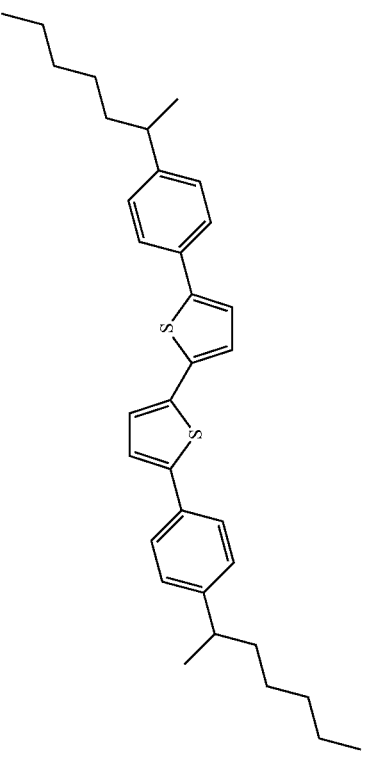<br>Molecular Weight = 514.84<br>Exact Mass = 514<br>Molecular Formula = C34H42S2<br>Molecular Composition = C 79.32% H 8.22% S 12.46%<br>5,5'-bis(4-(1-methylhexyl)phenyl)-2,2'-bithiophene | S: FIG. 3<br>P: extraction<br>Y: 35%. | Solubility about 100,000 ppm in THF |

TABLE 1-continued

| Short Name | Molecular Structure | Example Synthesis Routes S = synthetic procedure; P = purification; and Y = yield. | Formulation and processing (solubility, viscosity of formulation, deposition on substrate, film quality) |
|---|---|---|---|
| 6(1Et)-O-PTTP-O-6(1Et) | Molecular Weight = 574.89<br>Exact Mass = 574<br>Molecular Formula = C36H46O2S2<br>Molecular Composition = C 75.21% H 8.07% O 5.57% S 11.15%<br>5,5'—Bis-[4-(1-ethyl-hexyloxy)-phenyl]-[2,2']bithiophenyl | S: route B, FIG. 2<br>P: extraction<br>Y: 55% | Well soluble in THF (about 330,000 ppm) DSC: mp = 97–102° C., (broad transition) |
| TBDPS-O-PTTP-O-TBDPS | Molecular Weight = 827.28<br>Exact Mass = 826<br>Molecular Formula = C52H50O2S2Si2<br>Molecular Composition = C 75.50% H 6.09% O 3.87% S 7.75% Si 6.79%<br>5,5'-Bis-[4-(tert-butyl-diphenyl-silanyloxy)-phenyl]-[2,2']bithiophenyl | S: route C, FIG. 2<br>P: precipitation<br>Y: 42–73%<br>Precursor for bisphenol PTTP | Well soluble in THF |

TABLE 1-continued

| Short Name | Molecular Structure | Example Synthesis Routes<br>S = synthetic procedure;<br>P = purification; and<br>Y = yield. | Formulation and processing (solubility, viscosity of formulation, deposition on substrate, film quality) |
|---|---|---|---|
| 6(6TBDPSO)-O-PTTP-O-6(6TBDPSO) | Molecular Weight = 1027.60<br>Exact Mass = 1026<br>Molecular Formula = C64H74O4S2Si2<br>Molecular Composition = C 74.61% H 7.26% O 6.23% S 6.24% Si 5.47%<br>5,5'-Bis-{4-[6-(tert-butyl-diphenyl-silanyloxy)-hexyloxy]-phenyl}-[2,2']bithiophenyl | S: route B, FIG. 2<br>P: extraction<br>Y: 74%<br>Precursor for terminal OH-alkyl PTTP | Well soluble in THF (about 310,000 ppm) |

TABLE 1-continued

| Short Name | Molecular Structure | Example Synthesis Routes S = synthetic procedure; P = purification; and Y = yield. | Formulation and processing (solubility, viscosity of formulation, deposition on substrate, film quality) |
| --- | --- | --- | --- |
| 3(3THPO,2Me)-O-PTTP-O-3(THPO,2Me) | Molecular Weight = 662.91<br>Exact Mass = 662<br>Molecular Formula = C36H46O6S2<br>Molecular Composition = C 68.85% H 6.99% O 14.48% S 9.67%<br>5,5'-Bis-[4-(2-methyl-propoxy-tetrahydro-pyran)-phenoxy]-[2,2']bithiophenyl | S: route B, FIG. 2<br>P: extraction<br>Y: 48% | Well soluble in THF (about 75,000 ppm) |
| 3(3OH,2Me)-O-PTTP-O-3(3OH,2Me) | Molecular WEight = 494.68<br>Exact Mass = 494<br>Molecular Formula = C28H30O4S2<br>Molecular Composition = C 67.99% H 6.11% O 12.94% S 12.96%<br>3-(4-{5'-[4-(3-Hydroxy-2-methyl-propoxy)-phenyl]-[2,2']bithiophenyl-5-yl}-phenoxy)-2-methyl-propan-1-ol | S: route B, FIG. 2<br>P: extraction<br>Y: 59% | Low solubility in THF (600 ppm) |

TABLE 1-continued

| Short Name | Molecular Structure | Example Synthesis Routes S = synthetic procedure; P = purification; and Y = yield. | Formulation and processing (solubility, viscosity of formulation, deposition on substrate, film quality) |
|---|---|---|---|
| 7(3E,1OH)-PTTP-7(3E,1OH) | Molecular Weight = 602.95<br>Exact Mass = 602<br>Molecular Formula = C38H50O2S2<br>Molecular Composition = C 75.70% H 8.36% O 5.31% S 10.64%<br>5,5'-Bis-[4-(1-hydroxy-3-ethyl-heptyloxy)-phenyl]-[2,2']bithiophenyl | S: routes B and D, FIG. 2; route F reported below<br>P: chromatography<br>Y: 31% | Well soluble in THF (about 392,000 ppm); 1% soluble in pure cyclohexanol |
| 5[5(1,4diene)O$_2$C]-O-PTTP-O-5[5(1,4dieneO$_2$C] | Molecular Weight = 710.96<br>Exact Mass = 710<br>Molecular Formula = C42H46O6S2<br>Molecular Composition = C 70.96% H 6.52% O 13.60% S 9.02%<br>6-[4-(5'-{5-(1-Vinyl-allyloxycarbonyl)-pentyloxy]-phenyl}-[2,2']bithiophen-5-yl)-phenoxy]-hexanoic acid 1-vinyl-allyl ester | S: route B, FIG. 2<br>P: precipitation<br>Y: 64% | well soluble in THF (131,000 ppm) |

TABLE 1-continued

| Short Name | Molecular Structure | Example Synthesis Routes<br>S = synthetic procedure;<br>P = purification; and<br>Y = yield. | Formulation and processing (solubility, viscosity of formulation, deposition on substrate, film quality) |
|---|---|---|---|
| 6(2Et)NHC(O)-PTTP-C(O)NH6(2Et) | Molecular Weight = 628.95<br>Exact Mass = 628<br>Molecular Formula = C38H46N2O2S2<br>Molecular Composition = C 72.57% H 7.69% N 4.45% O 5.09% S 10.20%<br>5,5'-Bis-[4-N-(2-ethyl-hexyl)-benzamido]-[2,2']bithiophenyl | S: used teachings of MUSHRUSH<br>P: repeated crystallization<br>Y: 46% | DSC: mp = 270° C.<br>low solubility in THF (300 ppm) |
| HO-PTTP-OH | 5,5'-bis(4-hydroxy phenyl)-2,2'-bithiophene | S: route D, FIG. 2<br>P: crude product with sufficient purity<br>Y: 90%<br>precursor for different PTTP derivatives with branched alkyl chains | Solubility much lower than 6-PTTP-6 |
| OHC-PTTP-CHO | 5,5'-Bis-(4-formyl-phenyl)-[2,2']bithiophenyl | S: Mushrush<br>P: crystallization<br>Y: 59%<br>Precursor for different PTTP derivatives with branched alkyl chains containing hydroxyl groups. | Solubility like 6PTTP6 |
| 3O2PTTP2O3 | 5,5'—Bis(4-(propxy ethyl)phenyl)-2,2'-bithiophene | S: route F, reported below. | Solubility like 6PTTP6 |

FETs were fabricated using some of the organic semiconductors defined in Table 1. The FET structures fabricated included silicon wafers having overlaid silicon dioxide bodies, onto which the various PTTP semiconductors in Table 1 were deposited, followed by addition of gold source and drain electrodes. The silicon and silicon dioxide served as gate electrode and gate dielectric, respectively. The various PTTP semiconductors were either sublimed onto the silicon dioxide body on the wafer, or drop cast from solution. In one example, an FET was made having an organic semiconductor composition body 110 including 6-PTTP-6: $\mu$=2-6×10$^{-3}$ cm$^2$/Vs (fabrication of gate electrode/dielectric body/semiconductor body/source-drain electrodes: drop casting, Si/SiO$_2$/PTTP composition/Au). In another example, an FET was made having an organic semiconductor composition body 110 including 6-O—PTTP—O-6: $\mu$=1-1.5×10$^{-3}$ cm$^2$/Vs (drop casting, Si/SiO$_2$/PTTP composition/Au). In a further example, an FET was made having an organic semiconductor composition body 110 including 5(4Me)-O—PTTP—O-5(4 (Me): $\mu$=1-3×10$^{-4}$ cm$^2$/Vs (drop casting, Si/SiO$_2$/PTTP composition/Au); $\mu$=(1.7-4.0)×10$^{-3}$ cm$^2$/Vs (sublimed films at room temperature, Si/SiO$_2$/PTTP composition/Au); $\mu$=(6.1-8.5)×10$^{-3}$ cm$^2$/Vs (sublimed films at 70° C., Si/SiO$_2$/PTTP composition/Au). In an additional example, an FET was made having an organic semiconductor composition body 110 including 8(3,7Me)- O—PTTP—O-8(3,7Me): $\mu$=6×10$^{-6}$-5×10$^{-5}$ cm$^2$/Vs (drop casting, Si/SiO$_2$/PTTP composition/Au). In another example, an FET was made having an organic semiconductor composition body 110 including 4(2Et)- O—PTTP—O-4(2Et): $\mu$=10$^{-6}$-5×10$^{-5}$ cm$^2$/Vs (drop casting, Si/SiO$_2$/PTTP composition/Au). In a further example, an FET was made having an organic semiconductor composition body 110 including 6(2Me)- O—PTTP—O-6 (2Me): $\mu$=(2.0-2.7)×10$^{-4}$ cm$^2$/Vs (sublimed films at room temperature, Si/SiO$_2$/PTTP composition/Au); $\mu$=(3.3-4.8)×10$^{-4}$ cm$^2$/Vs (sublimed films at 70° C., Si/SiO$_2$/PTTP composition/Au). In an additional example, an FET was made having an organic semiconductor composition body 110 including 6(2Et)- O—PTTP—O-6(2Et): $\mu$=5×10$^{-8}$-×7×10$^{-7}$ cm$^2$/Vs (drop casting, Si/SiO$_2$/PTTP composition/Au); $\mu$=(1.2-2.4)×10$^{-5}$ cm$^2$/Vs (sublimed films at room temperature, Si/SiO$_2$/PTTP composition/Au); $\mu$=(6.2-9.4)×10$^{-5}$ cm$^2$/Vs (sublimed films at 70° C., Si/SiO$_2$/PTTP composition/Au). In another example, an FET was made having an organic semiconductor composition body 110 including 6(1Me)- O—PTTP—O-6(1Me): $\mu$=(1.2-4.3)×10$^{-4}$ cm$^2$/Vs (sublimed films at room temperature, Si/SiO$_2$/PTTP composition/Au); $\mu$=(6.5-9.8)×10$^{-4}$ cm$^2$/Vs (sublimed films at 70° C., Si/SiO$_2$/PTTP composition/Au). In a further example, an FET was made having an organic semiconductor composition body 110 including 6(1Et)- O—PTTP—O-6(1Et): $\mu$=(3.1-3.3)×10$^{-7}$ cm$^2$/Vs (sublimed films at room temperature, Si/SiO$_2$/PTTP composition/Au); $\mu$=4.4×10$^{-7}$ cm$^2$/Vs (sublimed films at 70° C., Si/SiO$_2$/PTTP composition/Au). In an additional example, an FET was made having an organic semiconductor composition body 110 including 6(6TBDPSO)—O—PTTP—O-6(6TBDPSO): $\mu$=(3.4-4.9)×10$^{-8}$ cm$^2$/Vs (sublimed films at room temperature, Si/SiO$_2$/PTTP composition/Au); $\mu$=(3.9-9.0)×10$^{-8}$ cm$^2$/Vs (sublimed films at 70° C., Si/SiO$_2$/PTTP composition/Au).

Figure 4:
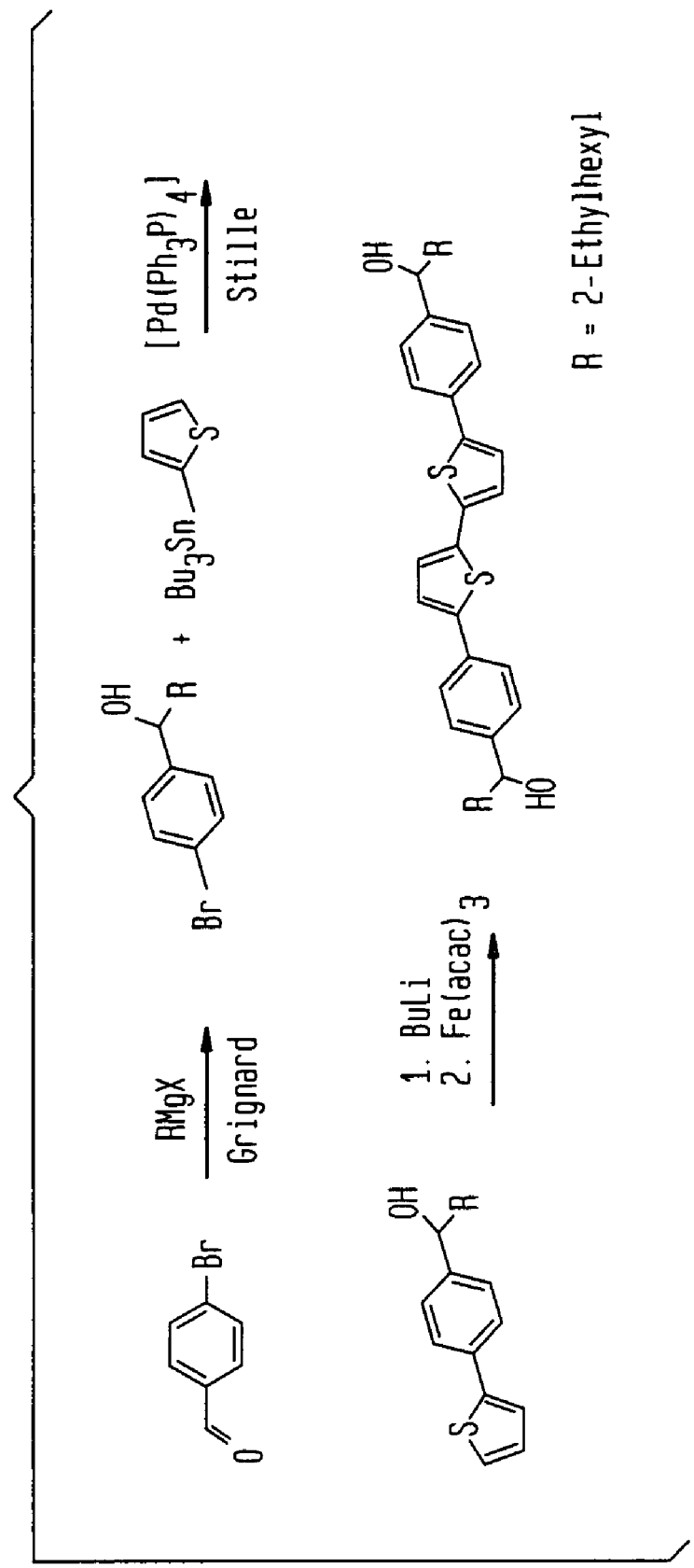
FIG. 4 shows synthesis scheme 3 as designated in Table 1.

FIG. 2 shows synthesis scheme 1 routes A, B, C, and D as designated above in Table 1. R designates an organic moiety. PG designates a protecting group. FIG. 3 shows synthesis scheme 2 as designated above in Table 1. Ph is "phenyl". The abbreviation "acac" is acetylacetonate. FIG. 4 shows synthesis scheme 3 as designated above in Table 1. "Mushrush" designates: Mushrush, M., Facchetti, A., Lefenfeld, M., Katz, H. E., and Marks T. J., "Easily processable phenylene-thiophene-based organic field-effect transistors and solution-fabricated nonvolatile transistor memory elements", *J. Am. Chem. Soc.*, vol. 125, pp. 9414-9423 (2003).

The composition 3O2PTTP2O3 was synthesized according to route F shown below, by adapting the synthesis procedure for 6PTTP6 (Mushrush), starting with (2-(4-bromophenyl)-ethyl) propyl ether instead of 4-hexyl bromobenzene. A mixture of 2-(4-bromophenyl)-ethanol (25 mmol, 5 g), 1-iodopropane (58 mmol, 10 g) and sodium hydride (27 mmol, 660 mg) was refluxed overnight in 200 ml THF. This refluxed composition was then cooled to room temperature and the organic layer was poured into water (200 mL). The organics were extracted with ethyl ether (3×200 mL), and the combined organics were then concentrated under vacuum to remove the solvents. Column chromatography of the residue (20:1 hexane/ethyl acetate eluent) and removal of solvents yielded the product (2-(4-bromophenyl)-ethyl)propyl ether in 33% yield. The composition was isolated by precipitation in methanol, and purified by repeated recrystallization in toluene.

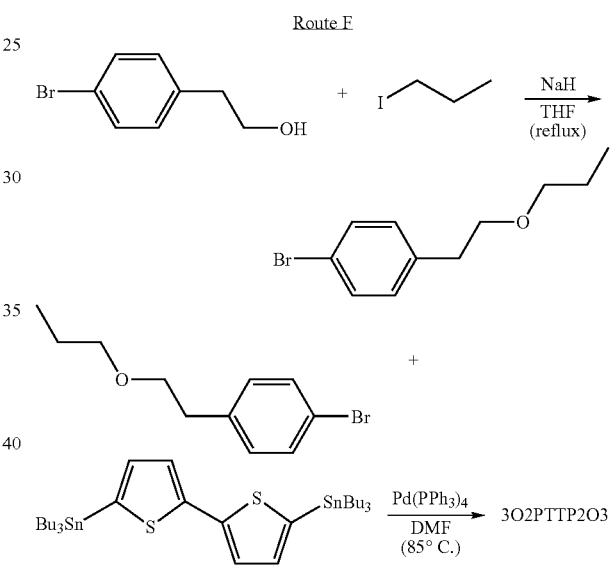

Route F

In one example, the organic semiconductor composition may include one or more of the following class of compositions. The organic semiconductor composition may include a chain-like core region having two ends and having at least three conjugated aromatic rings; and including at the two ends, branched groups R$^1$ and R$^2$ respectively, each including a C$_5$- to C$_{20}$-alkyl group. "Branched" means that a linear carbon skeleton is supplemented by a side-substituent other than hydrogen. As an example, groups R$^1$ and R$^2$ may be carbon-branched. As an example, each of the conjugated aromatic rings may be selected from the group consisting of a thiophene ring and a benzene ring. In another example, other types of conjugated aromatic rings, which may be substituted or unsubstituted and which may include heteroatoms, may be included or substituted for thiophene and benzene rings. As a further example, any thiophene rings in the core region may be 2,5-linked and any benzene rings in the core region may be 1,4-linked. In another example, each of the two ends may be selected from the group consisting of a 2-linked thiophene ring, and a 1-linked benzene ring. In an example of an implementation, each of R$^1$ and R$^2$ may be either 5-linked to a thiophene ring or 4-linked to a benzene ring. As another example, each of $R^1$ and $R^2$ may include, optionally ether at an end of or within a $C_5$- to $C_{20}$-alkyl group, an ether moiety. In a further implementation example, $R^1$ and $R^2$ may each be linked by an ether bond to the core region. The core region may, as an example, have between three and seven conjugated aromatic rings. In an additional implementation, each of $R^1$ and $R^2$ may include a branched $C_5$- to $C_{16}$-alkyl group. As an example, $R^1$ and $R^2$ may be acyclic.

The branched groups $R^1$ and $R^2$ (also referred to as "alkyl side chains") may be saturated or include unsaturation, and may be unsubstituted or may include substituents. The alkyl side chains may include one or more non-aromatic cycloalkyl groups. As an example, a cyclohexyl, cyclopentyl, or cyclobutyl group may be included. The cycloalkyl groups may be saturated or contain some unsaturation. In an example, the organic semiconductor composition may include a plurality of 2,5-linked thiophene rings and 1,4-linked benzene rings, which is substituted with one, two, or more alkyl side chains of 5 to 20 carbon atoms in length. By "2,5-linked" is meant that any linkages between a thiophene ring and another ring may be made at the 2 or 5 positions of the thiophene moiety, the sulfur atom being at the 1 position. By "1,4-linked" is meant that any linkages between a benzene ring and another ring may be made at mutually-para positions of the benzene moiety. In a further example, the organic semiconductor composition may include two 2,5-linked thiophene rings and two 1,4-linked benzene rings, the thiophene rings being interposed between the benzene rings, the composition being substituted at each of the two terminal 4 positions of the benzene rings with an alkyl chain of 5 to 20 carbon atoms in length. In another example, the organic semiconductor composition may include a 2,5-linked thiophene tetramer, pentamer or other-mer, substituted at each of the two 5-positions of the terminal thiophene rings with an alkyl chain of 5 to 20 carbon atoms in length.

In one example, the organic semiconductor composition includes one or more of the following class of compositions:

Formula 1

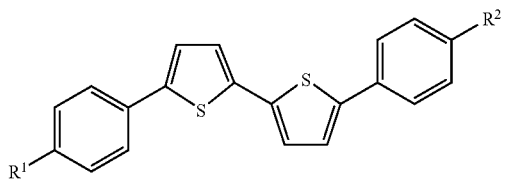

wherein $R^1$ and $R^2$ each include branched $C_5$- to $C_{20}$-alkyl groups; in each case optionally including, either at an end of or within the branched $C_5$- to $C_{20}$-alkyl groups, an ether moiety, an aldehyde moiety, an alkyl amide moiety, and optionally including substitution by hydroxy, a protective group such as tetrahydropyrane or diphenyl tert butyl silane, or a crosslinkable moiety such as —1-vinyl-allyl esters. The structure of $R^1$ may be different than the structure of $R^2$, or the structure of $R^1$ may be the same as the structure of $R^2$.

Further information on related organic semiconductor compositions is disclosed in U.S. patent application Ser. No. 11/241,642, filed concurrently herewith by Florian Dötz, Ingolf Hennig, Howard Katz, Elsa Reichmanis and Subramanian Vaidyanathan and entitled "ORGANIC SEMICONDUCTORS", the entirety of which hereby is incorporated herein by reference.

In one example, substituents for $R^1$ and $R^2$ may be selected to have an electronegativity of about 3.5 or less. Substituents having electronegativity greater than about 3.5 may have an electron withdrawing effect on the aromatic rings sufficient to unduly reduce p-type charge carrier mobility in the organic semiconductor composition. $R^1$ and $R^2$ may include some substitution by —Cl, —Br, and —I. Excessive halogenation and substitution by —F may induce n-type charge carrier mobility in the organic semiconductor composition. Substituents for $R^1$ and $R^2$ may also include other functional groups, for example, nitro, amino, sulfonyl and carbonyl, provided that such functional groups are sufficiently distanced from the aromatic core region so as not to adversely affect charge carrier mobility.

In case of any compositions above having stereoisomeric centers including as examples compositions among those within the above Formula (1), both the racemic mixtures and the optically active stereoisomers are contemplated. It is to be understood that all of the above classes of semiconductor molecules may be in monomeric form or may be linked, while still satisfying the above-defined structural requirements, into polymeric forms. Polymeric semiconductors tend to have lower charge carrier mobility than do small organic molecules. The alkyl side chains in relatively small molecules may aid in crystal packing, leading to better alignment and higher charge carrier mobility. The side chains may also serve as a protective barrier to degradation by oxygen and water. Small organic molecules may have higher charge carrier mobility, on/off ratios, and chemical stability. However, polymers may more easily form elongated films from liquid phase deposition. Here, "small organic molecules" means molecules having a well defined molecular weight, for example, a molecular weight of less than about 1,000 grams per Mole.

The organic dielectric composition may generally include any organic composition suitable to be mobilized in a liquid phase and then formed into a solid body having the necessary dielectric performance capability. However, organic dielectric compositions that cannot be so mobilized in a liquid phase may further be present, provided that they constitute a minor proportion of the organic dielectric composition. Inorganic moieties, species, and elements may also be included in the organic dielectric composition.

Example classes of suitable organic dielectric compositions include polyvinylpyrrolidone ("PVP"), polyvinylalcohol ("PVA"), polyurethane ("PU"), copolymers of styrene and butadiene, and hydrogenated copolymers of styrene and butadiene. The foregoing PVP and PVA polymers may be doped in the form of, for example, an aqueous dispersion, with an insulator such as $BaTiO_3$ in order to upwardly adjust the polymer's dielectric constant. $BaTiO_3$ is commercially available from Du Pont. Further information on active devices made by utilizing hydrogenated copolymers of styrene and butadiene is disclosed in U.S. patent application Ser. No. 11/240,298, filed concurrently herewith by Florian Dötz and Ingolf Hennig and owned by BASF Aktiengesellschaft, entitled "ACTIVE SEMICONDUCTOR DEVICES", the entirety of which hereby is incorporated herein by reference.

Dielectric constant and volume resistivity data for examples of organic dielectric compositions are reported in Table 2. All dielectric constant data herein are unitless and were measured in accordance with IEC standard 60250. Volume resistivity was measured according to IEC 60093. Throughout this specification, reported dielectric constants and volume resistivities were determined for dielectric bodies standing alone. For each measurement of dielectric constant and volume resistivity, the organic dielectric composition was spin coated onto indium-tin oxide ("ITO")-coated glass and suitably dried to form a body. The ITO coating served as one electrode, and the other electrode was applied as a layer of conducting silver or carbon paint or colloidal graphite. The volume resistivity needs to be relatively high in order to insulate the gate electrode from the source and drain electrodes at the small dielectric body thicknesses employed.

TABLE 2

| Dielectric composition | Dielectric constant | volume resistivity (Ωcm) | |
|---|---|---|---|
| PVA | 7.8*** | $8 \times 10^{12}$* | $8 \times 10^{13}$** |
| PVP | 2.4**** | $3 \times 10^{13}$* | $4 \times 10^{11}$** |
| PVP/BaTiO$_3$ dispersion | 26.5**** | $1 \times 10^{11}$* | $1 \times 10^{13}$** |
| Hydrogenated styrene-butadiene dispersion | 2.3*** | $<4 \times 10^{8}$* | |
| Cytop ® Perfluoro(1-butenyl vinyl ether) homo cyclopolymer | 2.1*** | $3 \times 10^{15}$* | $6 \times 10^{14}$** |
| PU | 6*** | $1 \times 10^{13} - 1 \times 10^{14}$*** | |
| Styrene/butadiene dispersion | | $1 \times 10^{12} - 1 \times 10^{15}$*** | |
| Luxprint | 40*** | | |

*after 10 minutes drying at 80° C.
**after 10 minutes drying at 80° C. and then 5 minutes at room temperature in air
***at room temperature in air
****at 25° C., 50% relative humidity In one example, the dielectric constant of the organic dielectric composition body is at least about two (2). In another example, the dielectric constant of the organic dielectric composition body is at least about four (4). In a further example, the dielectric constant of the organic dielectric composition body is within a range of between about six (6) and about forty (40).

As an example, a selected organic dielectric composition may be soluble in a solvent such as saturated hydrocarbons having between 5 and 12 carbon atoms, alcohols having between 1 and 6 carbon atoms optionally including water, and mixtures.

In examples where the organic semiconductor composition includes a PTTP derivative, the organic semiconductor composition may also be somewhat susceptible to nonpolar organic solvents. Hence, organic dielectric compositions that are solvated by nonpolar organic solvents may at least slightly solvate PTTP derivative organic semiconductor compositions, thus negatively affecting charge carrier mobility. Accordingly, as an example, water-based organic dielectric compositions may be effectively used in combination with organic semiconductor compositions including PTTP derivatives. Example water-based organic dielectric compositions that may be used include: PVA, PVA-titanium dioxide ("TiO$_2$") dispersions, PVA-barium-titanate ("BaTiO$_3$") dispersions, and polyurethane ("PU"). Styrene-butadiene ("SB") dispersions were found to have ineffective dielectric performance with PTTP derivatives.

An example of a class of hydrophobic organic dielectric polymers that may be used is perfluoro(1-butenyl vinyl ether) homocyclopolymers. Such polymers are commercially available from the Asahi Glass Company under the trademark CYTOP® ("CYTOP"). In one example, a homopolymer having one of the following structures is employed:

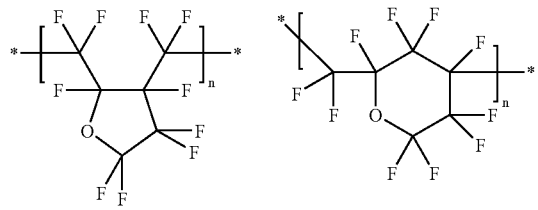

In another example, poly[4,5-difluoro-2,2-bis(trifluoromethyl)-1,3-dioxole-co-tetrafluoroethylene, having the following structure, may be utilized:

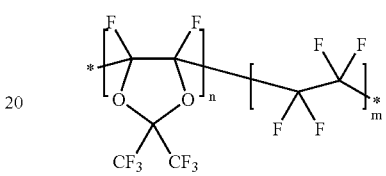

This fluorinated low k dielectric material is commercially available from Sigma-Aldrich under the trade name Teflon® AF 2400 (catalogue number 469629).

FIG. 5 shows an example of a process 500 for fabrication of the laminate 100. In step 505, a support body 105 is provided as earlier discussed. In step 510, an organic semiconductor composition body 110 is provided on the support body 105. The organic semiconductor body 110 may be formed in any suitable manner on the support body 105. For example, a selected organic semiconductor composition may be vaporized and deposited onto the support body 105. Alternatively for example, a selected organic semiconductor is mobilized in a liquid medium and deposited onto the support body 105. The liquid medium may be removed, for example, by directing an inert gas such as nitrogen over the laminate 100. Heat may also be applied.

In step 515, an organic dielectric composition is selected and mobilized in a liquid medium as earlier discussed.

In step 520, the organic dielectric composition, as mobilized in the liquid medium, is applied onto the organic semiconductor composition body 110. The organic semiconductor composition, the organic dielectric composition, and the liquid medium for mobilizing the organic dielectric composition, are selected to be mutually compatible, meaning that the solvent chosen for the dielectric composition does not dissolve the chosen organic semiconductor composition. In this manner, the liquid medium may effectively mobilize the organic dielectric composition in order to carry out step 520 shown in FIG. 5. In one example, a spin-casting process is employed to apply the organic dielectric composition in order to form the organic dielectric composition body 120. The liquid medium may be removed in the same manner as discussed in connection with step 510.

Combinations of an organic semiconductor composition, an organic dielectric composition, and a solvent that may be suitable for use include the following:

1. 1-MH—PTTP+PVP+water
2. 1-MH—PTTP+PVA+water
3. 1-MH—PTTP+PVA dispersion with BaTiO$_3$+water
4. 1-MH—PTTP+PVP dispersion with BaTiO$_3$+water
5. 1-MH—PTTP+polyolefin+heptane or octane (lower alkanes may dissolve the 1-MH-PTTP 6. 1-MH—PTTP+CYTOP®+perfluorotributylamine
7. 1-MH—PTTP+(CYTOP®+PVA)+(perfluorotributylamine+water)
8. F8T2+PVA+water
9. F8T2+polyolefin+heptane or octane (lower alkanes often may be used because they do not dissolve the F8T2)
10. F8T2+CYTOP®+perfluorotributylamine
11. F8T2+polyolefin+heptane or octane+Luxprint® (paste, used as received)
12. F8T2+CYTOP®+perfluorotributylamine+Luxprint® (paste, used as received)
13. F8T2+PVA+water+Luxprint® (paste, used as received)

The semiconductors 1-MH—PTTP and F8T2 may additionally not be soluble in other polar solvents, and may be soluble in other non-polar solvents.

Figure 6:
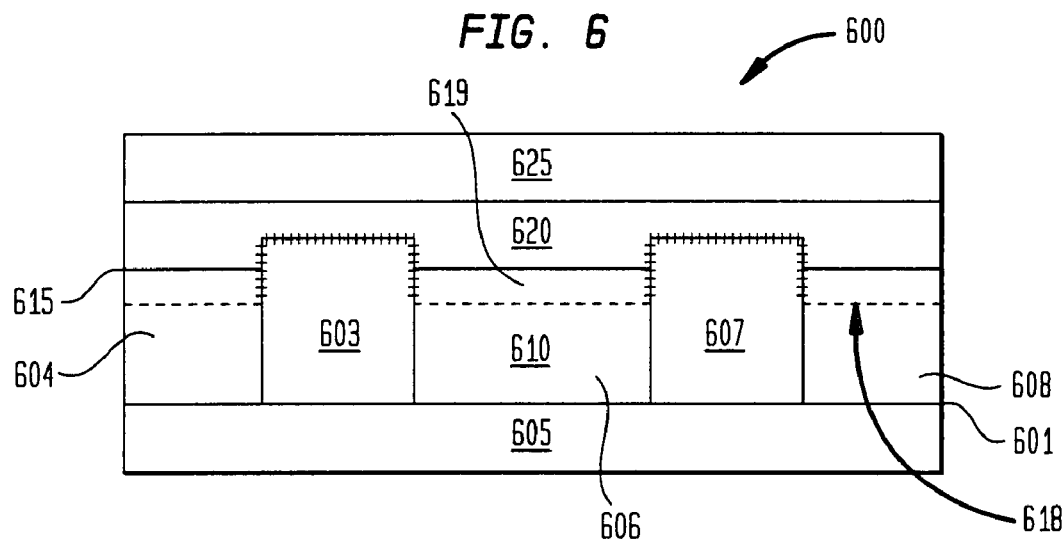
FIG. 6 shows a cross-sectional side view of another example of a laminate having a support body having bonded thereon an organic semiconductor composition body and an organic dielectric composition body.

FIG. 6 shows a cross-sectional side view of an example of a laminate 600 having a support body 605 having bonded thereon an organic semiconductor composition body 610. Interposed between regions 604, 606 and 608 of the organic semiconductor composition body 610 on the support body 605 are source and drain electrodes 603 and 607, respectively. The organic semiconductor composition body 610 forms an interface 615 with an organic dielectric composition body 620 bonded to the semiconductor body 610. In this example, the source and drain electrodes 603 and 607 penetrate partially into the organic dielectric composition body 620, as indicated by ticked lines. In an alternative example, the source and drain electrodes 603 and 607 do not penetrate into the organic dielectric composition body 620. The organic semiconductor composition body 610 is interposed between the support body 605 and the organic dielectric composition body 620. A gate electrode 625 is bonded onto the organic dielectric composition body 620. The laminate 600 may for example be fabricated by first providing the source and drain electrodes 603 and 607, respectively, on the support body 605. The source and drain may be made using various techniques such as laser ablation and offset printing. The organic semiconductor composition body 610 is then provided on the support body 605. Next, the organic dielectric composition body 620 is provided to form the interface 615 with the organic semiconductor composition body 610. The gate electrode 625 is then provided on the organic dielectric composition body 620.

As an example, the source and drain electrodes 603 and 607 respectively may be fabricated directly onto the support body 605. Referring to FIG. 6, the source electrode 603 and drain electrode 607 are laterally defined and mutually spaced apart along the interface 601 between the support body 605 and the organic semiconductor composition body 610, in order to avoid electrical shorting. Hence, this direct fabrication permits optimization of deposition conditions for the source electrode 603 and the drain electrode 607. Fabrication of the organic semiconductor composition body 610 prior to fabrication of the organic dielectric composition body 620 enables the realization of this direct fabrication of the source electrode 603 and the drain electrode 607 on the support body 605.

In this example, the organic semiconductor composition body 610 may be fabricated on the support body 605 from either a liquid or vapor phase, as the composition of the support body 605 may readily be selected from a broad range of potential materials that are not adversely affected by, nor that adversely affect, the organic semiconductor composition body 610 being formed. In the same manner as discussed in connection with FIG. 1, however, fabrication of the organic dielectric composition body 620 to form the interface 615 on the organic semiconductor composition body 610 is carried out in a manner such that mutual compatibility between the organic semiconductor composition body 610 and the organic dielectric composition body 620 is provided both during and after fabrication.

The organic dielectric composition body 620 is fabricated from an organic dielectric composition mobilized in a liquid medium. Deposition of the organic dielectric composition in a form mobilized in a liquid medium is carried out in a manner such that mutual compatibility between the organic semiconductor composition body 610 and the liquid medium for the organic dielectric composition body 620 is provided both during and after their fabrication. The liquid medium is selected so that the organic dielectric composition may be adequately mobilized for liquid phase deposition on the organic semiconductor composition body 610, but substantially without mobilizing or adversely reacting with the organic semiconductor composition. In this manner, the integrity and desired surface functionality of the organic semiconductor composition body 610 are maintained at the interface 615, as discussed above in connection with FIG. 1.

In an alternative example, an additional organic dielectric composition body 619 is interposed between the organic semiconductor composition body 610 and the organic dielectric composition body 620, and the dotted line 618 replaces the interface 115. In this example, the organic dielectric composition body 619 may have a relatively lower dielectric constant than does the organic dielectric composition body 620. As an example, a hydrogenated copolymer of styrene and butadiene, which may be formulated as a solution in n-alkanes having between four and twelve carbon atoms, may be utilized. The term "n-alkanes" means one or more linear-chain alkanes having the indicated number of carbon atoms. Such a multi-bodied structure generates less dipolar disorder at the interface 618, and yields a smoother interface 618, for example, when the organic dielectric composition body 619 is deposited from a high boiling non-polar solvent. In one example, the non-polar solvent includes a carbon chain having between 5 and 20 carbon atoms. In another example, the non-polar solvent includes a carbon chain having between 6 and 12 carbon atoms. In a further example, the non-polar solvent may be hexane, heptane, octane, or a mixture. The organic dielectric composition body 619 and the dielectric composition body 620 are formed of compositions that may form a suitable bond together and which do not adversely react physically or chemically during or after fabrication of the laminate 600. See Veres, J. et al., "Low-k Insulators as the Choice of Dielectrics in Organic Field-Effect Transistors", Adv. Funct. Mater., Vol. 13, No. 3, pp. 199-205 (2003).

The example of a laminate 600 may be operated as an FET, by connecting the source and drain electrodes 603 and 607 and the gate electrode 625 to external circuitry. In one example, access to the source electrode 603 and the drain electrode 607 for such external connections is provided by pathways made through the organic dielectric composition body 620. In another example, the support body 605 is completely or partially removed to facilitate external connections.

FIG. 7 shows an example of a process 700 for fabrication of the laminate 600. In step 705, a support body 605 is provided as earlier discussed. In step 710, source and drain electrodes 603 and 607, respectively, are provided on the support body 605. The source electrode 603 and drain electrode 607 may be formed in any suitable manner on the support body 605. For example, a selected charge carrier conductive composition such as a metal or metal alloy including copper, aluminum, gold, silver, platinum, palladium, and/or nickel, may be electroplated or vaporized and deposited through a mask onto the support body 605. Alternatively, a conductive body formed from a selected charge carrier conductive composition may be deposited by any suitable process onto the support body 605, such as by electrodeposition, direct coating, or sputtering, and then selectively etched. Further, a selected charge carrier conductive polymer such as polyethylenethioxythiophene ("PEDOT"), may be mobilized by a suitable solvent and printed onto the support body 605. In step 715, an organic semiconductor composition body 610 is provided on the support body 605. The organic semiconductor composition body 610 may be formed in any suitable manner on the support body 605, as discussed in connection with FIG. 6. In step 730, a first organic dielectric composition is selected and mobilized in a first liquid medium as earlier discussed. In addition, the first organic semiconductor composition and the first organic dielectric composition are selected for mutual compatibility, such that the first liquid medium does not dissolve the first organic semiconductor composition. In step 735, the first organic dielectric composition, as mobilized in the first liquid medium, is applied onto the organic semiconductor composition body 610. In one example, a spin-casting process is employed to apply the first organic dielectric composition in order to form the first organic dielectric composition body 620. The first liquid medium may then be removed, for example, by directing an inert gas such as nitrogen over the laminate 600. Heat may also be applied.

In an alternative example, a second organic dielectric composition mobilized in a liquid medium is additionally provided in step 720. The second organic dielectric composition is selected and mobilized in a liquid medium as earlier discussed. The second organic dielectric composition is employed to form the organic dielectric composition body 619, interposed between the organic semiconductor composition body 610 and the first organic dielectric composition body 620. The second organic dielectric composition may be selected to have a relatively low dielectric constant compared with that of the first organic dielectric composition. The organic dielectric composition body 619 may also be thin, thus serving as a sub-optimum dielectric barrier. Accordingly, the organic semiconductor composition, the second organic dielectric composition, and the first organic dielectric composition desirably are selected for mutual compatibility, such that the liquid media for the first and second organic dielectric compositions do not dissolve the organic semiconductor composition. In step 725, the second organic dielectric composition, as mobilized in the liquid medium, is applied onto the organic semiconductor composition body 610. In one example, a spin-casting process is employed to apply the second organic dielectric composition in order to form the second organic dielectric composition body 619. The liquid medium may then be removed in the same manner as discussed in connection with step 735. Steps 730 and 735 are then carried out as discussed above.

In step 740, the gate electrode 625 is provided on the organic dielectric composition body 620. The gate electrode 625 may be formed in any suitable manner on the organic dielectric composition body 620. For example, a selected charge carrier conductive composition as discussed earlier may be vaporized or solvated and deposited onto the organic dielectric composition body 620. Vaporization, if employed, is carried out with care to minimize disturbance of the organic semiconductor and organic dielectric compositions. The selected charge carrier conductive composition may be deposited by any other suitable process onto the organic dielectric composition body 620. Masking and etching processes or printing processes may be carried out if desired, for example if multiple laminates 600 are being simultaneously fabricated on an integral support body 605.

Figure 8:
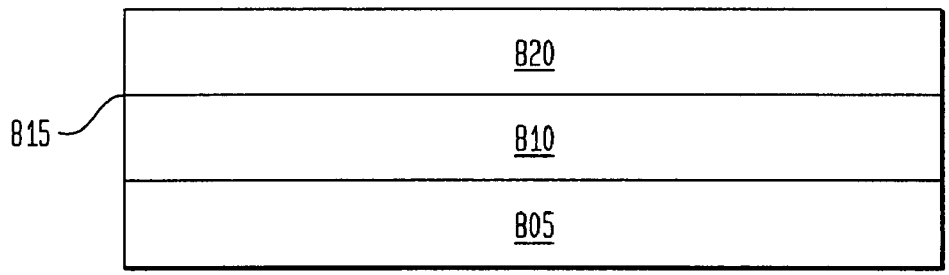
FIG. 8 shows a cross-sectional side view of an example of a laminate having a support body having bonded thereon an organic dielectric composition body and an organic semiconductor composition body.

FIG. 8 shows a cross-sectional side view of an example of a laminate 800 having a support body 805 having bonded thereon an organic dielectric composition body 810. The organic dielectric composition body 810 forms an interface 815 with an organic semiconductor composition body 820 bonded to the dielectric body 810. The organic dielectric composition body 810 is interposed between the support body 805 and the organic semiconductor composition body 820. The laminate 800 may for example be fabricated by first providing the organic dielectric composition body 810 on the support body 805, and then providing the organic semiconductor composition body 820 to form the interface 815 with the organic dielectric composition body 810.

In this example, the organic dielectric composition body 810 may be fabricated on the support body 805 from either a liquid or vapor phase, as the composition of the support body 805 may readily be selected from a broad range of potential materials so as not to adversely react with or be mobilized by, and not mobilize, the organic dielectric composition body 810 being formed. Fabrication of the organic semiconductor composition body 820 to form the interface 815 on the organic dielectric composition body 810 is carried out in a manner such that mutual compatibility between the organic semiconductor composition body 820 and the organic dielectric composition body 810 is provided both during and after their fabrication, such that the liquid medium for the organic semiconductor composition does not dissolve the organic dielectric composition body 810. In this example, the organic semiconductor composition body 820 is fabricated from an organic semiconductor composition mobilized in a liquid medium. The liquid medium for the organic semiconductor is selected so that the organic semiconductor composition may be adequately mobilized for liquid phase deposition on the organic dielectric composition body 810, substantially without mobilizing or adversely reacting with the organic dielectric composition body 810. In this manner, the integrity and desired surface functionality of the organic semiconductor composition body 820 are maintained at the interface 815. For example, the organic dielectric composition body 810 is not substantially dissolved by the liquid medium. In addition, the organic semiconductor composition body 820 does not incur a substantial adverse effect caused by the organic dielectric composition. For example, if the organic dielectric composition body 810 were to be mobilized in the liquid medium for the organic semiconductor composition and were then to leach substantial conductive moieties out from the organic semiconductor composition, the charge carrier mobility of the resulting organic semiconductor composition body 820 could be degraded.

As examples, combinations of an organic semiconductor composition, a solvent for the semiconductor, and an organic dielectric composition that may be suitable for use include the following:

1. 1-MH—PTTP+THF+PVP
2. 1-MH—PTTP+THF+PVA
3. 1-MH—PTTP+THF+(PVA dispersion with BaTiO$_3$)
4. 1-MH—PTTP+THF+(PVP dispersion with BaTiO$_3$)
5. 1-ME—PTTP+THF+polyolefin
6. 1-MH—PTTP+THF+CYTOP®
7. 1-MH—PTTP+THF+(CYTOP®+PVA)
8. F8T2+xylene+PVP
9. F8T2+xylene+PVA
10. F8T2+xylene+(PVA dispersion with BaTiO$_3$)
11. F8T2+xylene+(PVP dispersion with BaTiO$_3$)

12. F8T2+xylene+polyolefin
13. F8T2+xylene+CYTOP®
14. F8T2+xylene+(CYTOP®+PVA)

Figure 9:
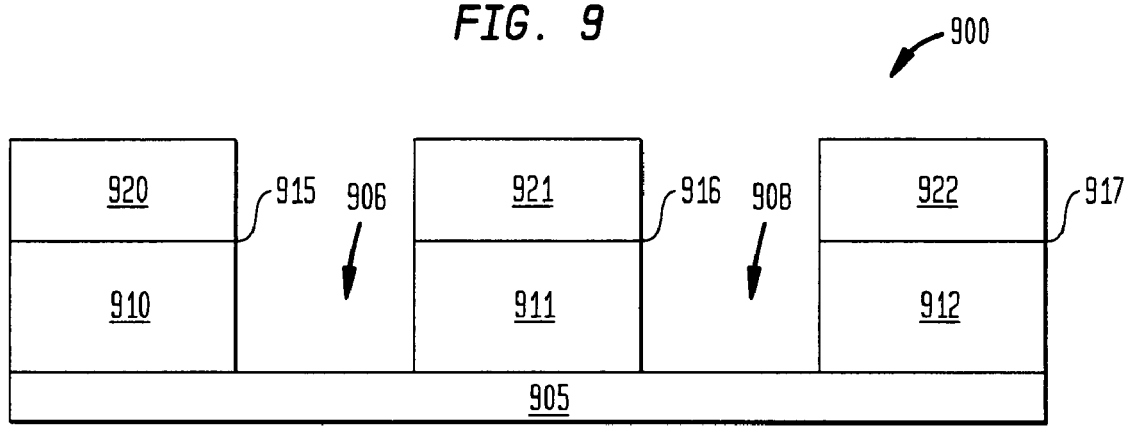
FIG. 9 shows a cross-sectional side view of an example of a laminate having a support body having bonded thereon a plurality of organic semiconductor composition bodies and a plurality of organic dielectric composition bodies over intermittent regions of the support body.

FIG. 9 shows a cross-sectional side view of an example of a laminate 900 having a support body 905 having bonded thereon a plurality of organic semiconductor composition bodies 910, 911 and 912 over intermittent regions of the support body 905. A plurality of example exposed regions 906 and 908 of the support body 905 serve to mutually space apart the organic semiconductor composition bodies 910-912. The organic semiconductor composition bodies 910, 911 and 912 respectively form interfaces 915, 916 and 917 with dielectric composition bodies 920, 921 and 922 respectively bonded to the semiconductor bodies 910, 911 and 912. The organic semiconductor composition bodies 910-912 are interposed between the support body 905 and the dielectric composition bodies 920-922, respectively. The laminate 900 may for example be fabricated by first providing the organic semiconductor composition bodies 910-912 on the support body 905, and then providing the dielectric composition bodies 920-922 in registration with the organic semiconductor composition bodies 910-912 to form the interfaces 915-917, respectively. In this regard, the support body 905 as shown in FIG. 9 is a representative portion of an elongated web on which the laminate 900 may be fabricated on a continuous basis in any desired length.

In one example, the process 500 is carried out on an elongated web in order to produce a plurality of laminates 900. The elongated web may, for example, be suitable for reel-to-reel continuous processing of a high surface area having a plurality of laminates 900 in a spaced apart array on the elongated web. In one example, the laminates 900 have example exposed regions 906 and 908. In this case, the organic semiconductor composition is intermittently applied onto the support body 905 to form the representative organic semiconductor composition bodies 910-912. The organic dielectric composition may then be applied onto the organic semiconductor composition bodies 910-912, and if desired, may also be applied over the representative exposed regions 906 and 908 of the support body 905 to form an elongated body of the organic dielectric composition. Alternatively, the organic semiconductor composition bodies 910-912 may be integrated into an elongated organic semiconductor composition body on the support body 905, and the organic dielectric composition bodies 920-922 may be integrated into an elongated organic dielectric composition body on the support body 905. In the latter case an elongated three-body laminate is formed having the structure of the laminate 100 shown in FIG. 1. Referring to FIGS. 6 and 8, the laminate 600 and laminate 800 may analogously constitute elongated multi-body laminates.

In one example, the example of a process 500 is carried out on an elongated web in order to produce a plurality of laminates 900 using a continuous gravure printing process. Gravure, a type of intaglio printing, makes use of the ability of ink to adhere to shallow scratches and depressions on a polished metal plate. In one example, rotogravure is used, employing a web press equipped with a cylindrical metal plate that rotates on its axis. A web or sheet of a selected elongated support body passes between the rotating cylindrical plate and an impression roll, transferring ink onto the elongated support body. Gravure inks generally have a low viscosity in order to allow them to be drawn into engraved cells on the metal gravure plate and then be transferred onto the elongated support body. High volume air dryers are placed in position to then dry the ink prior to any subsequent additional printing steps. Water-based inks require a higher drying temperature and longer drying time than do inks employing more volatile solvents having a higher vapor pressure.

In another example, the example of a process 500 is carried out on an elongated web in order to produce a plurality of laminates 900, using a continuous offset printing process. For example, offset gravure or offset lithography may be used. In offset printing processes, ink is not applied directly from a printing plate or cylinder to the elongated support body. Instead, ink is applied to the printing plate to form the image to be printed, and is then transferred to a rubber blanket. The image on the blanket is then transferred to the elongated support body. In lithography, the intended image areas of the printing plate or cylinder are treated to make them selectively hydrophobic, and the remaining surface area of the plate or cylinder remains hydrophilic. An aqueous fountain solution is then applied to the plate or cylinder to wet the hydrophilic regions and prevent subsequent adherence of a hydrophobic ink to them. A hydrophobic ink composition is then applied to the image areas of the plate or cylinder. The image is then successively transferred to the offset blanket and then to the elongated support body. Printing inks for offset lithography generally are viscous and paste-like, in order to reduce their flow beyond the image areas onto the non-image hydrophobic areas.

Other printing processes may be used. For example, ink jet printing may be used. However, ink jet printing is generally imprecise and implicates transfer of ink particles across a distance onto the body, which typically is not optimum for a continuous fabrication process.

The organic semiconductor composition bodies and the organic dielectric composition bodies may be fabricated on the support body in each case using a printing ink including the respective compositions. The solvents employed in making such inks are desirably selected to have boiling points that are not too low or too high. In one example, the solvents have boiling points within a range of between about 50° C. and about 200° C. In another example, the solvents have boiling points within a range of between about 60° C. and about 150° C. If the solvent boiling point is too high, then evaporation of the solvent after printing of the ink becomes problematic. If the solvent boiling point is too low, then the composition may also be tacky at moderate temperatures such that its physical structure remains unstable. The surface tension of the printing ink needs to be sufficiently low so that the ink may wet the support body surface and be separated from the support body surface, and if employed, the offset blanket. In one example of gravure printing, an ink is used having a surface tension within a range of between about 22 milli-newtons per meter ("mN/m") and about 32 mN/m; and having a viscosity within a range of between about 40 milli-Pascals per second ("mPas") and about 800 mPas. In one example of offset printing, an ink is used having a surface tension within a range of between about 30 mN/m and about 60 mN/m; and having a viscosity within a range of between about 5000 mPas and about 100,000 mPas.

EXAMPLE 1

An FET having a structure consistent with that shown in FIG. 6 was fabricated using the process described in connection with FIG. 7. The support body used was a polyethylene naphthalate ("PEN") polyester foil obtained from DuPont Teijin Films U.S. Limited Partnership, 1 Discovery Drive, P.O. Box 411, Hopewell, Va. 23860 U.S.A., sold under the trade name, Teonex Q 51, attached to a glass slide with scotch tape. The source and drain electrodes were fabricated from polyethylenedioxythiophene ("PEDOT"), offset printed at an average thickness of about 1 micron ("μ"). The channel length, the minimum path distance between the source and drain electrodes, ("L") was 120 microns. The organic semiconductor composition body used was spin coated from a 5% weight/weight solution in tetrahydrofuran (THF) of 5,5'-bis (4-(1-methylhexyloxy)phenyl)-2,2'-bithiophene ("1-MH-PTTP"), and had an average thickness of about 200 nanometers ("nm"). The organic dielectric composition body was spin coated from an aqueous solution of polyvinyl alcohol ("PVA"), having an average thickness of about 1.4μ. The gate electrode was gold evaporated onto the organic dielectric composition body. The resulting FET was connected into an external circuit. The mobility of the FET was $1 \times 10^{-3}$ centimeters squared per volt-second ("cm$^2$/Vs"), and the on/off ratio was 190 calculated from the output characteristic.

An additional FET was fabricated in the same manner as reported above in this Example 1, except that: the source and drain electrodes were fabricated of gold, formed by evaporation; the organic semiconductor composition body used was spin coated from a 3% weight/weight solution in THF; and the organic dielectric composition body was spin coated from an aqueous solution of PVA, having an average thickness of about 3.5μ. In addition, after spin coating, the semiconductor composition body was annealed at 150° C. for 15 minutes and then slowly cooled, which may yield more and better semiconductor crystal domains. The melting point of 1-MH-PTTP is 145° C., slightly below the annealing temperature. The mobility of the FET was $4.8 \times 10^{-3}$ cm$^2$/Vs, and the on/off ratio was 6 calculated from the output characteristic.

EXAMPLE 2

An additional FET was fabricated in the same manner, except that the source and drain electrodes were laser-patterned and a 0.5% weight/weight solution in tetrahydrofuran (THF) of 1-MH-PTTP was used, further including 1% by weight of polystyrene ("PS") having an average molecular weight of about $2.75 \times 10^6$ grams per mole and a polydispersivity ("PDI") of about 1.05. The apparent viscosity η of a 10% weight/weight solution of PS in THF is 400 milliPascal seconds ("mPas") at a shear rate γ of 100/second ("s"). Accordingly, PS may be used to adjust the rheological properties of the semiconductor printing ink, such as viscosity, surface tension and adhesion. Further information on related additives for organic semiconductor compositions is disclosed in U.S. patent application Ser. No. 11/240,733, filed concurrently herewith by Florian Dötz, Ingolf Hennig, and Frauke Richter, and entitled "ORGANIC COMPOSITIONS", the entirety of which hereby is incorporated herein by reference. The PS-modified organic semiconductor composition was used to fabricate an organic semiconductor composition body having an average thickness of about 1,700 nm. The organic dielectric composition body was spin coated from an aqueous solution of PVA, having an average thickness of about 3,500 nm. The mobility of the FET was $7 \times 10^{-3}$ cm$^2$/Vs, and the on/off ratio, calculated from the output characteristics, was 20. Hence, addition of the PS to improve printability of the organic semiconductor ink did not adversely affect the mobility of the fabricated FET.

EXAMPLE 3

An FET having a structure consistent with that shown in FIG. 6 was fabricated using the process described in connection with FIG. 7. The support body used was a poly(ethyleneterephthalate) ("PET") foil attached to a glass slide. The source and drain electrodes were fabricated from laser patterned PEDOT, at an average thickness of about 0.3μ. The organic semiconductor composition body used was spin coated from a 3% weight/weight solution in o-xylene of poly (9,9'-dioctylfluorene-co-bithiophene) ("F8T2"), and had an average thickness of about 100 nm. The organic dielectric composition body was spin coated from a 10% weight/weight solution, in perfluorotributylamine, of a CYTOP® perfluoro (1-butenyl vinyl ether) homocyclopolymer commercially available from the Asahi Glass Company ("CYTOP"), having an average thickness of about 1.9μ. The gate electrode was carbon ink painted onto the organic dielectric composition body. The resulting FET was connected into an external circuit. The mobility of the FET was $4.3 \times 10^{-4}$ cm$^2$/Vs, and the on/off ratio, calculated from the output characteristics, was 30.

EXAMPLE 4

Another FET was fabricated having a structure consistent with that shown in FIG. 6, including first- and second-deposited organic dielectric composition bodies corresponding to organic dielectric composition bodies 619 and 620 respectively. This FET was fabricated using the process described in connection with FIG. 7. The support body used was a copolymer PEN foil attached to a glass slide with scotch tape. The source and drain tkelectrodes were offset printed with PEDOT, at an average thickness of about 1μ. The organic semiconductor composition body used was spin coated from a 3% weight/weight solution in o-xylene of F8T2, and had an average thickness of about 60 nm after drying at 100 degrees centigrade ("° C.") for 15 minutes. The first-deposited organic dielectric composition body was a 2% weight/weight solution in hexane of a hydrogenated copolymer of styrene and butadiene formulated as a solution in n-alkanes having between four and twelve carbon atoms. This organic dielectric composition body was dried at 70° C. for 15 minutes. The second-deposited organic dielectric composition body was spin coated Luxprint® paste including BaTiO$_3$, having an average thickness of about 9μ. This organic dielectric composition body was dried at 70° C. for 15 minutes. The gate electrode was carbon ink painted onto the second-deposited organic dielectric composition body. The resulting FET was connected into an external circuit. The mobility of the FET was $3.2 \times 10^{-3}$ cm$^2$/Vs, and the on/off ratio, calculated from the output characteristics, was 5291.

EXAMPLE 5

Another FET was prepared in the same manner as in Example 4, except that the source and drain electrodes were offset printed and the first-deposited organic dielectric composition body was a 2% weight/weight solution in hexane of a hydrogenated copolymer of styrene and butadiene formulated as a solution in n-alkanes having between four and twelve carbon atoms, which was cured for about 5 minutes at about 80° C. to remove the solvent; and the F8T2 was annealed to 80° C. after deposition to form the organic semiconductor composition body. The resulting FET was connected into an external circuit. The mobility of the FET was $8.1 \times 10^{-3}$ cm$^2$/Vs, and the on/off ratio, calculated from the output characteristics, was 13,100.

EXAMPLE 6

Figure 10:
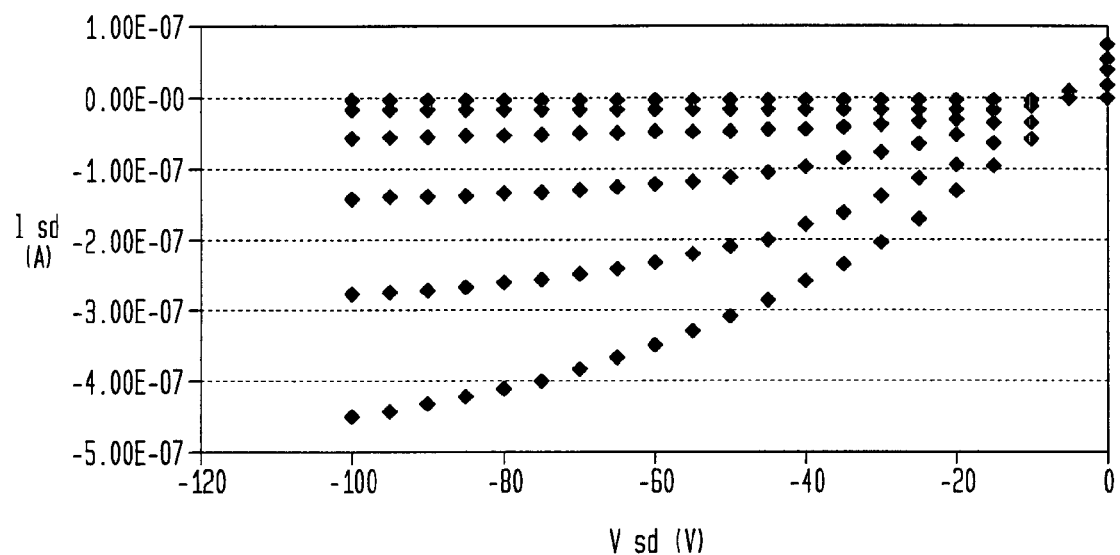
FIG. 10 shows graphs plotting the drain-source current versus the drain-source voltage for Example 6, for various applied gate voltages.

An FET having a structure consistent with that shown in FIG. 6 was fabricated using the process described in connection with FIG. 7. The support body used was a PET foil attached to a glass slide. The source and drain electrodes were fabricated from gold, printed at an average thickness of 0.1μ. The organic semiconductor composition body used was spin coated from a 300 parts-per-million ("ppm") solution in toluene ("TOL") of poly(3,3"-dioctylterthiophene) ("PTT-8"), and had an average thickness within a range of between about 50 nm and about 250 nm. An organic dielectric composition body was dip coated at a rate of 0.25 centimeters per second onto the organic semiconductor composition body from a 5% weight/weight aqueous solution of polyvinyl alcohol ("PVA"), having an average thickness of about 1μ. An additional organic dielectric composition body was spin coated onto the PVA dielectric composition, constituted by Luxprint® including $BaTiO_3$, having an average thickness of about 9μ. The gate electrode was conductive carbon paint applied onto the $BaTiO_3$-dielectric composition body. The resulting FET was connected into an external circuit. The mobility of the FET was $3.5\times10^{-3}$ cm$^2$/Vs, and the on/off ratio was 86.8. FIG. 10 shows a graph plotting the source-drain current ($I_{sd}(A)$) versus the source-drain voltage ($V_{sd}(V)$). In the graph, the scale on the right is exponential; "1.00E-07" signifies $1\times10^{-7}$.

EXAMPLE 7

Figure 11:
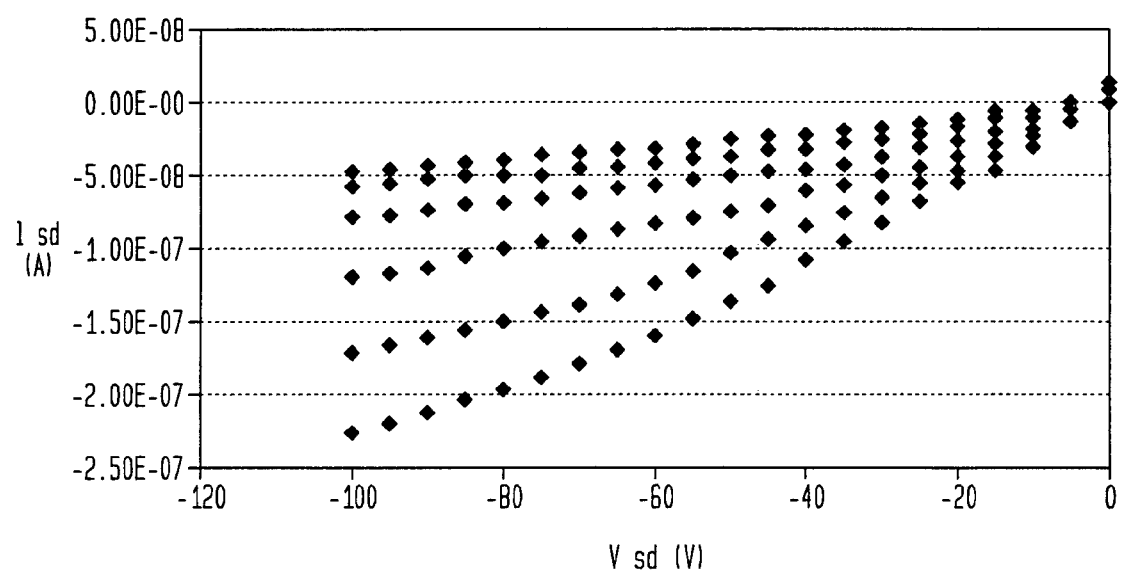
FIG. 11 shows graphs plotting the drain-source current versus the drain-source voltage for Example 7, using various applied gate voltages.

An FET having a structure consistent with that shown in FIG. 6 was fabricated using the process described in connection with FIG. 7. The support body used was a PEN foil attached to a glass slide. The source and drain electrodes were fabricated from gold, printed at an average thickness of 0.1μ. The organic semiconductor composition body used was spin coated from a 300 ppm solution in toluene ("TOL") of PTT-8, and had an average thickness within a range of between about 50 nm and about 250 nm. An organic dielectric composition body was dip coated at a rate of 0.025 centimeters per second onto the organic semiconductor composition body from a 5% weight/weight aqueous solution of PVA, having an average thickness of about 1μ. An additional organic dielectric composition body was spin coated onto the PVA dielectric composition body, constituted by Luxprint® including $BaTiO_3$, having an average thickness of about 9μ. The gate electrode was conductive carbon paint applied onto the $BaTiO_3$-dielectric composition body. The resulting FET was connected into an external circuit. The mobility of the FET was $6.5\times10^{-4}$ cm$^2$/Vs, and the on/off ratio was 4.68. FIG. 11 shows a graph plotting the source-drain current (Isd(A)) versus the source-drain voltage (Vsd(V)).

EXAMPLE 8

Figure 12:
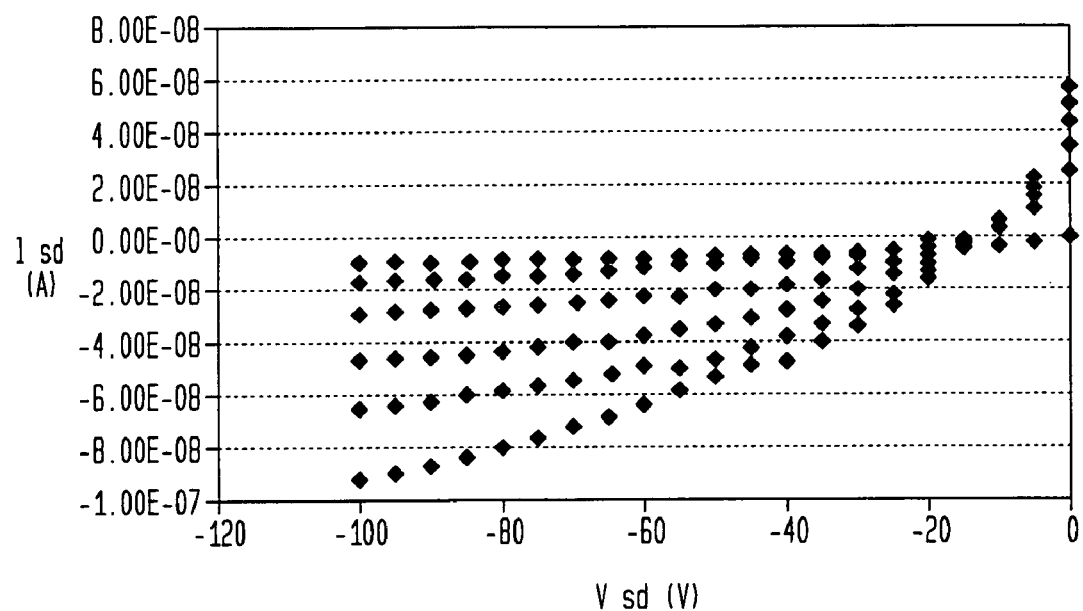
FIG. 12 shows graphs plotting the drain-source current versus the drain-source voltage for Example 8, using various applied gate voltages.

An FET having a structure consistent with that shown in FIG. 6 was fabricated using the process described in connection with FIG. 7. The support body used was a PEN foil attached to a glass slide. The source and drain electrodes were fabricated from PEDOT. A fluoro-boundary was applied to the support body before application of the semiconductor, following the teachings of Katz U.S. Pat. No. 6,403,397 issued on Jun. 11, 2002, entitled "Process for fabricating organic semiconductor device involving selective patterning" and assigned to Lucent Technologies Inc., the entirety of which is hereby incorporated herein by reference. The organic semiconductor composition body used was drop cast at a temperature of 80° C. from a 300 ppm solution in xylene ("XYL") of PTT-8, and had an average thickness within a range of between about 50 nm and about 250 nm. An organic dielectric composition body was dip coated at a rate of 0.025 centimeters per second onto the organic semiconductor composition body from a 5% weight/weight aqueous solution of PVA, having an average thickness of about 1μ. An additional organic dielectric composition body was spin coated onto the PVA dielectric composition body, constituted by Luxprint® including $BaTiO_3$, having an average thickness of about 9μ. The gate electrode was conductive carbon paint applied onto the $BaTiO_3$-dielectric composition body. The resulting FET was connected into an external circuit. The mobility of the FET was $1.2\times10^{-3}$ cm$^2$/Vs, and the on/off ratio was 11.2. FIG. 12 shows a graph plotting the source-drain current (Isd(A)) versus the source-drain voltage (Vsd(V)).

EXAMPLE 9

Figure 13:
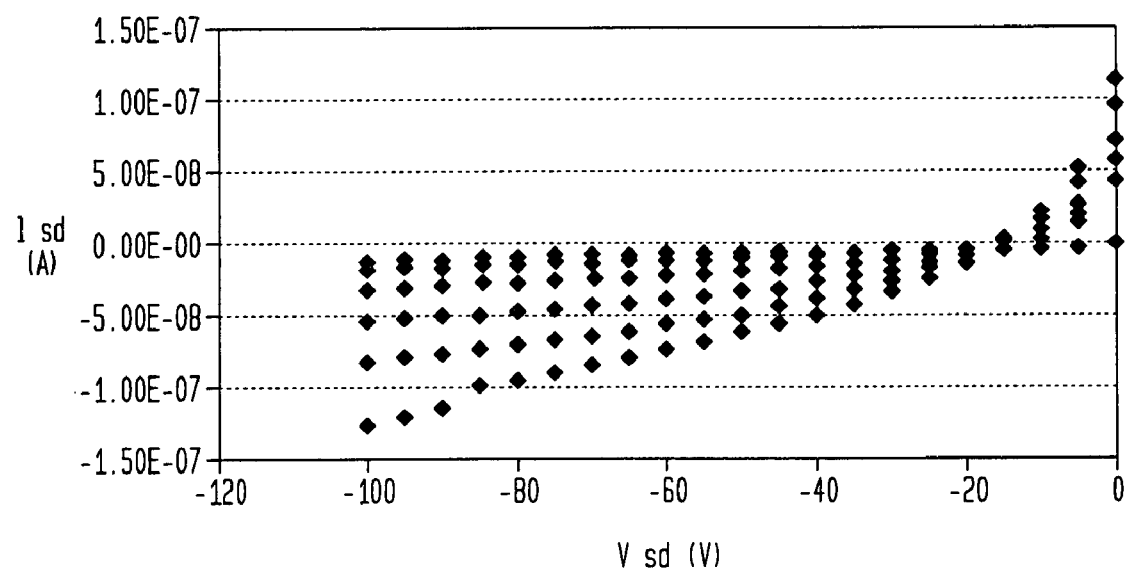
FIG. 13 shows graphs plotting the drain-source current versus the drain-source voltage for Example 9, using various applied gate voltages.

An FET having a structure consistent with that shown in FIG. 6 was fabricated using the process described in connection with FIG. 7. The support body used was a PEN foil attached to a glass slide. The source and drain electrodes were fabricated from PEDOT. The organic semiconductor composition body used was spin cast at 1,000 revolutions per minute ("rpm") from a 0.1% weight/weight solution in cyclobenzene ("CB") of PTT-8, and had an average thickness within a range of between about 50 nm and about 250 nm. An organic dielectric composition body was dip coated at a rate of 0.025 centimeters per second onto the organic semiconductor composition body from a 5% weight/weight aqueous solution of PVA, having an average thickness of about 1μ. An additional organic dielectric composition body was spin coated onto the PVA dielectric composition body, constituted by Luxprint® including $BaTiO_3$, having an average thickness of about 9μ. The gate electrode was conductive carbon paint applied onto the $BaTiO_3$— dielectric composition body. The resulting FET was connected into an external circuit. The mobility of the FET was $1.7\times10^{-3}$ cm$^2$/Vs, and the on/off ratio was 11.2. FIG. 13 shows a graph plotting the source-drain current (Isd (A)) versus the source-drain voltage (Vsd(V)).

EXAMPLE 10

Figure 14:
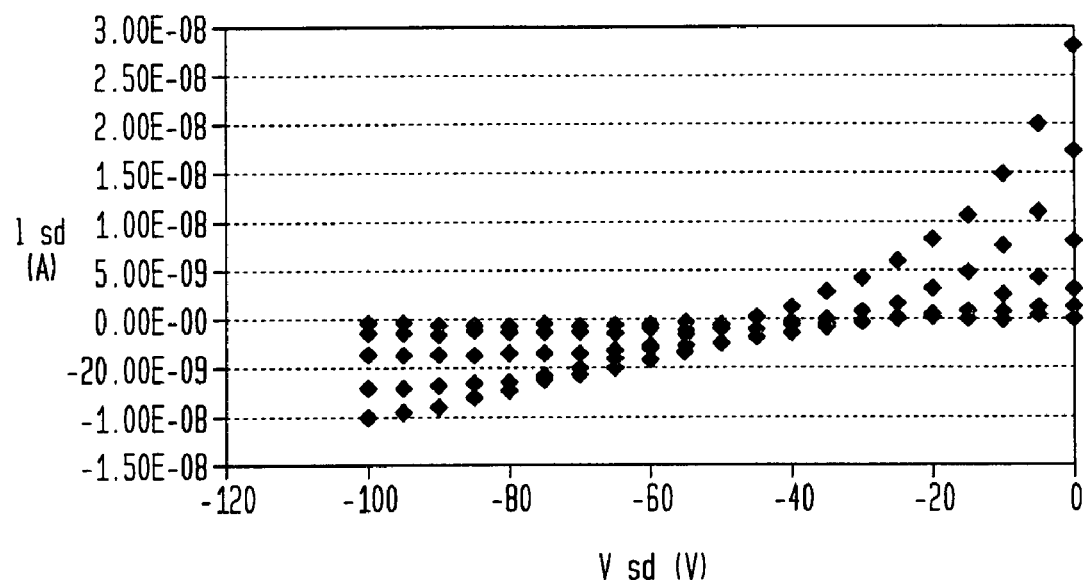
FIG. 14 shows graphs plotting the drain-source current versus the drain-source voltage for Example 10, using various applied gate voltages.

An FET having a structure consistent with that shown in FIG. 6 was fabricated using the process described in connection with FIG. 7. The support body used was a PEN foil attached to a glass slide. The source and drain electrodes were fabricated from gold, vapor evaporated at an average thickness of 0.1μ. A fluoro-boundary was applied to the support body before application of the semiconductor in the same manner as discussed in connection with Example 8. The organic semiconductor composition body used was drop cast at a temperature of about 125° C. from a 400 parts per million ("ppm") solution in xylene ("XYL") of 5,5'-bis(4-hexylphenyl)-2,2'-bithiophene ("6PTTP6"), and had an average thickness within a range of between about 50 nm and about 250 nm. Other example solvents that may be used include THF and THF/cyclohexanol. An organic dielectric composition body was dip coated at a rate of 0.25 centimeters per second onto the organic semiconductor composition body from a 15% weight/weight aqueous solution of PVA, having an average thickness of about 1.5μ. An additional organic dielectric composition body was spin coated onto the PVA dielectric composition body, constituted by Luxprint® including $BaTiO_3$, having an average thickness of about 9μ. The gate electrode was conductive carbon paint applied onto the $BaTiO_3$ dielectric composition body. The resulting FET was connected into an external circuit. The mobility of the FET was $5\times10^{-4}$ cm$^2$/Vs, and the on/off ratio was 13. FIG. 14 shows a graph plotting the source-drain current (Isd(A)) versus the source-drain voltage (Vsd(V)).

EXAMPLE 11

Figure 15:
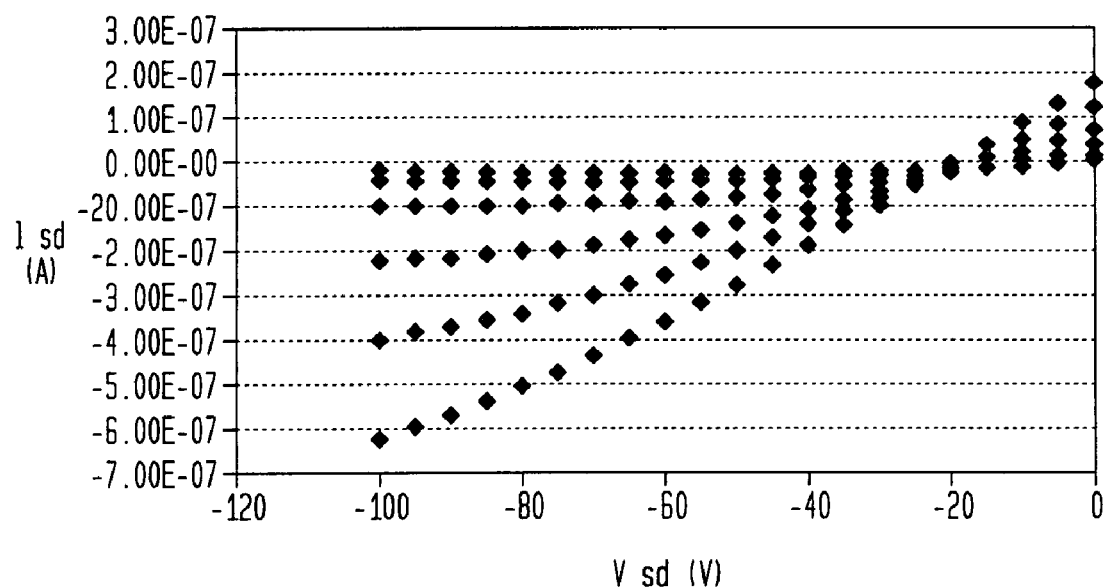
FIG. 15 shows graphs plotting the drain-source current versus the drain-source voltage for Example 11, using various applied gate voltages.

An FET having a structure consistent with that shown in FIG. 6 was fabricated using the process described in connection with FIG. 7. The support body used was a PEN foil attached to a glass slide. The source and drain electrodes were fabricated from gold, vapor evaporated at an average thickness of 0.1μ. The organic semiconductor composition body used was vapor deposited 5,5'-bis(4-propoxyethyl)-2,2'-bithiophene ("3O2PTTP2O3"), and had an average thickness within a range of between about 50 nm and about 250 nm. An organic dielectric composition body was dip coated at a rate of 0.5 centimeters per second onto the organic semiconductor composition body from a 15% weight/weight aqueous solution of PVA, having an average thickness of about 2μ. The gate electrode was conductive carbon paint applied onto the PVA dielectric composition body. The resulting FET was connected into an external circuit. The mobility of the FET was $3 \times 10^{-3}$ cm$^2$/Vs, and the on/off ratio was 27.1. FIG. 15 shows a graph plotting the source-drain current (Isd(A)) versus the source-drain voltage (Vsd(V)).

EXAMPLE 12

Figure 16:
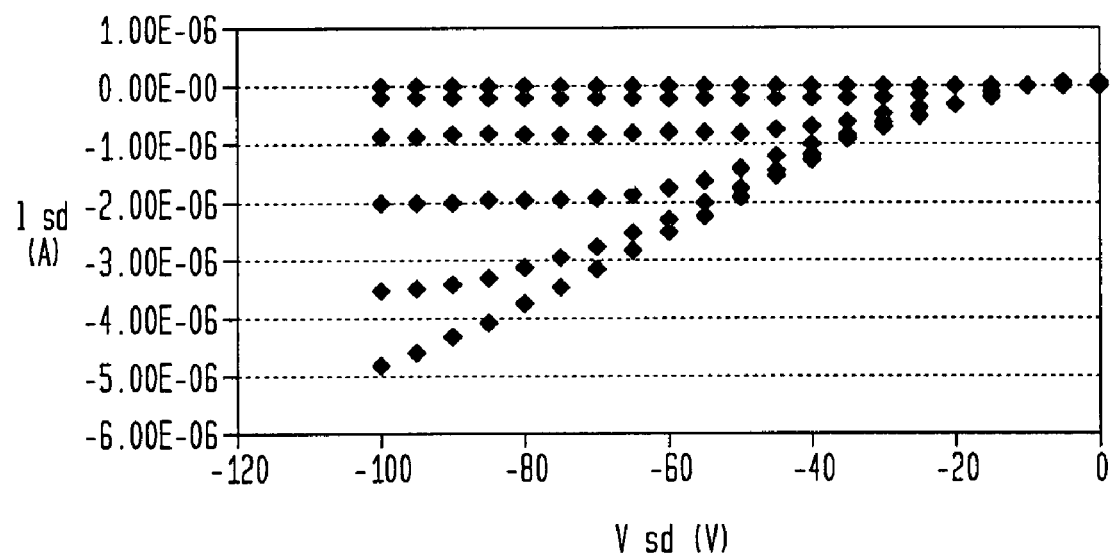
FIG. 16 shows graphs plotting the drain-source current versus the drain-source voltage for Example 12, using various applied gate voltages.

An FET having a structure consistent with that shown in FIG. 6 was fabricated using the process described in connection with FIG. 7. The support body used was a PET foil attached to a glass slide. The source and drain electrodes were fabricated from PEDOT, offset printed at an average thickness of about 1μ. A fluoro-boundary was applied to the support body before application of the semiconductor in the same manner as discussed in connection with Example 8. The organic semiconductor composition body used was drop cast at a temperature of about 70° C. from a 1% weight/weight solution in TOL of 6,13-bis(triisopropylsilylethynyl)pentacene ("TIPS"), and had an average thickness within a range of between about 50 nm and about 250 nm. An organic dielectric composition body was dip coated at a rate of 0.025 centimeters per second onto the organic semiconductor composition body from a 15% weight/weight aqueous solution of PVA, having an average thickness of about 1μ. An additional organic dielectric composition body was spin coated onto the PVA dielectric composition body, including Luxprint® including BaTiO$_3$, having an average thickness of about 9μ. The gate electrode was conductive carbon paint applied onto the BaTiO$_3$ dielectric composition body. The resulting FET was connected into an external circuit. The mobility of the FET was $2 \times 10^{-2}$ cm$^2$/Vs, and the on/off ratio was 572. FIG. 16 shows a graph plotting the source-drain current (Isd(A)) versus the source-drain voltage (Vsd(V)).

EXAMPLE 13

Figure 17:
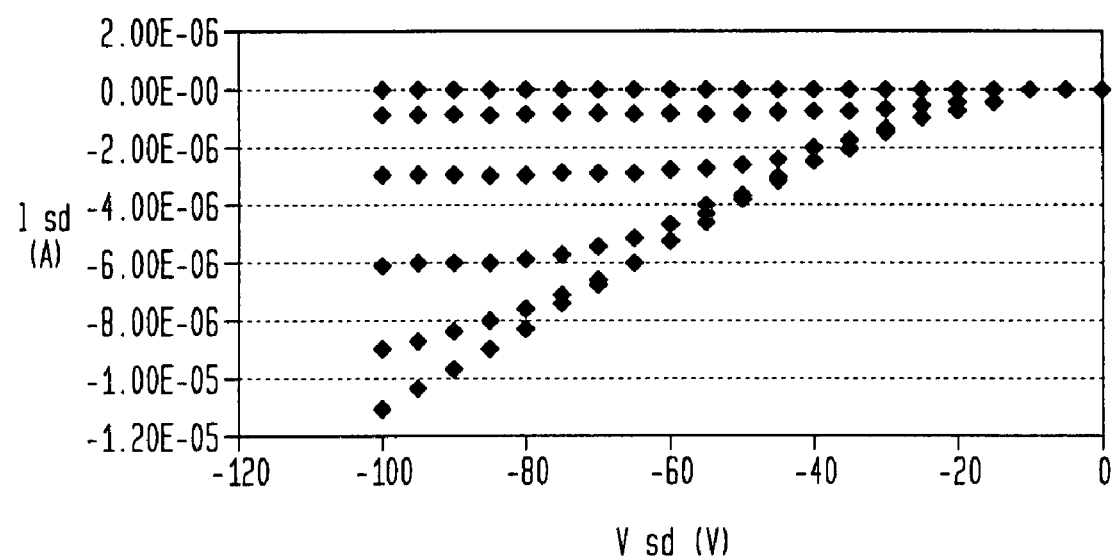
FIG. 17 shows graphs plotting the drain-source current versus the drain-source voltage for Example 13, using various applied gate voltages.

An FET having a structure consistent with that shown in FIG. 6 was fabricated using the process described in connection with FIG. 7. The support body used was a PET foil attached to a glass slide. The source and drain electrodes were fabricated from PEDOT, offset printed at an average thickness of about 1μ. A fluoro-boundary was applied to the support body before application of the semiconductor in the same manner as discussed in connection with Example 8. The organic semiconductor composition body used was drop cast at a temperature of about 90° C. from a 1% weight/weight solution of TIPS in TOL, and had an average thickness within a range of between about 50 nm and about 250 nm. An organic dielectric composition body was dip coated at a rate of 0.025 centimeters per second onto the organic semiconductor composition body from a 15% weight/weight aqueous solution of PVA, having an average thickness of about 1μ. An additional organic dielectric composition body was spin coated onto the PVA dielectric composition body, constituted by Luxprint® including BaTiO$_3$, having an average thickness of about 9μ. The gate electrode was conductive carbon paint applied onto the BaTiO$_3$ dielectric composition body. The resulting FET was connected into an external circuit. The mobility of the FET was $4.7 \times 10^{-2}$ cm$^2$/Vs, and the on/off ratio was 112. FIG. 17 shows a graph plotting the source-drain current (Isd(A)) versus the source-drain voltage (Vsd(V)).

EXAMPLE 14

Figure 18:
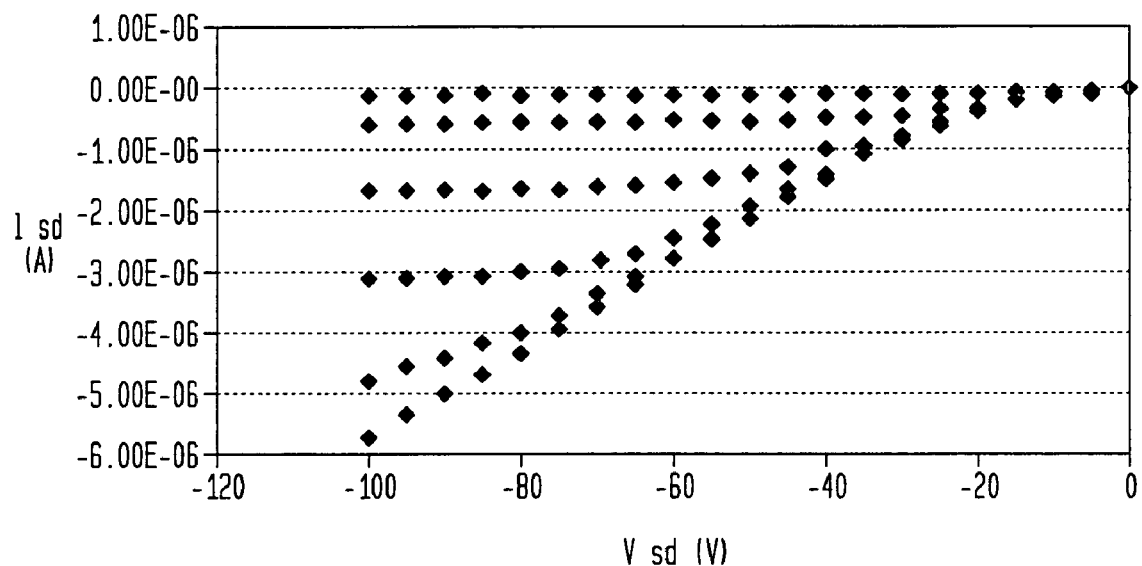
FIG. 18 shows graphs plotting the drain-source current versus the drain-source voltage for Example 14, using various applied gate voltages.
Figure 19:
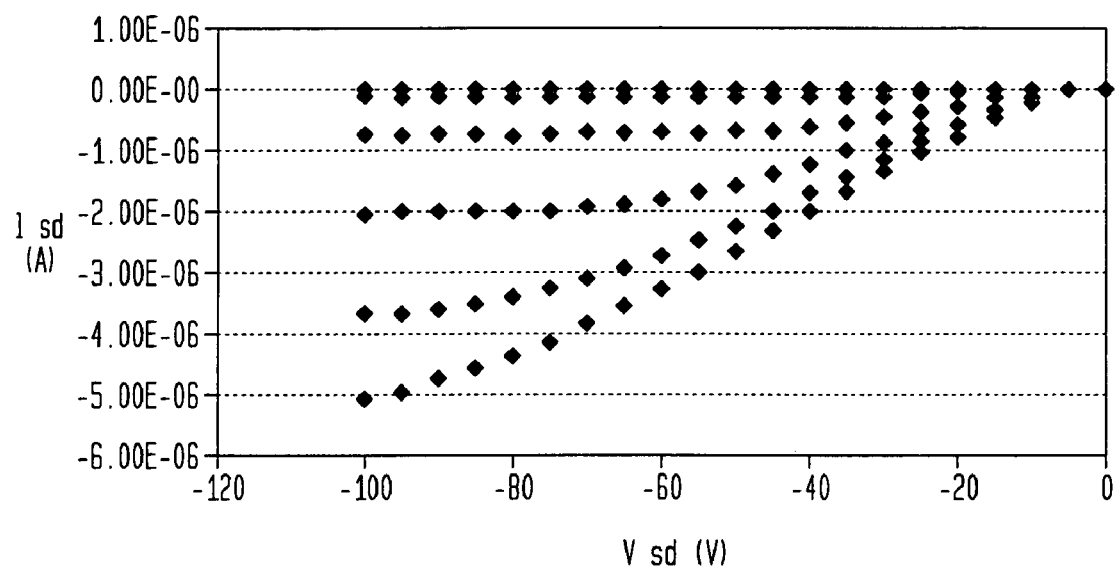
FIG. 19 shows graphs plotting the drain-source current versus the drain-source voltage for Example 15, using various applied gate voltages.

An FET having a structure consistent with that shown in FIG. 6 was fabricated using the process described in connection with FIG. 7. The support body used was a PET foil obtained from DuPont Teijin Films, attached to a glass slide. The source and drain electrodes were fabricated from PEDOT, offset printed at an average thickness of about 1μ. A fluoro-boundary was applied to the support body before application of the semiconductor in the same manner as discussed in connection with Example 8. The organic semiconductor composition body used was drop cast at a temperature of about 110° C. from a 1% weight/weight solution of TIPS in TOL, and had an average thickness within a range of between about 50 nm and about 250 nm. An organic dielectric composition body was dip coated at a rate of 0.025 centimeters per second onto the organic semiconductor composition body from a 15% weight/weight aqueous solution of PVA, having an average thickness of about 1μ. An additional organic dielectric composition body was spin coated onto the PVA dielectric composition body, constituted by Luxprint® including BaTiO$_3$, having an average thickness of about 9μ. The gate electrode was conductive carbon paint applied onto the BaTiO$_3$ dielectric composition body. The resulting FET was connected into an external circuit. The mobility of the FET was $2.7 \times 10^{-2}$ cm$^2$/Vs, and the on/off ratio was 59.8. FIG. 18 shows a graph plotting the source-drain current (Isd(A)) versus the source-drain voltage (Vsd(V)).

EXAMPLE 15

An FET having a structure consistent with that shown in FIG. 6 was fabricated using the process described in connection with FIG. 7. The support body used was a PET foil obtained from DuPont Teijin Films attached to a glass slide. The source and drain electrodes were fabricated from PEDOT, offset printed at an average thickness of about 1μ. A fluoro-boundary was applied to the support body before application of the semiconductor in the same manner as discussed in connection with Example 8. The organic semiconductor composition body used was drop cast at a temperature of about 110° C. from a 0.5% weight/weight solution of TIPS in TOL, and had an average thickness within a range of between about 50 nm and about 250 nm. An organic dielectric composition body was dip coated at a rate of 0.025 centimeters per second onto the organic semiconductor composition body from a 15% weight/weight aqueous solution of PVA, having an average thickness of about 1μ. An additional organic dielectric composition body was spin coated onto the PVA dielectric composition body, constituted by Luxprint® including BaTiO$_3$, having an average thickness of about 9μ. The gate electrode was conductive carbon paint applied onto the BaTiO$_3$ dielectric composition body. The resulting FET was connected into an external circuit. The mobility of the FET was $2.3 \times 10^{-2}$ cm$^2$/Vs, and the on/off ratio was 353. FIG.

19 shows a graph plotting the source-drain current (Isd(A)) versus the source-drain voltage (Vsd(V)).

For an example of a p-type semiconductor capable of transporting holes, electrical conductivity is approximated by the formula σ=enμ$_d$ where μ$_d$ is the carrier mobility, e is the charge on the carriers, and n is the density of free carriers. Conductivity accordingly is proportional to mobility. Mobility may readily be measured, and the corresponding conductivity may be approximated. Conductivity in a device having an organic semiconductor depends on the size and separation of crystal grains. The size distribution of crystal grains determines how many of them must be effectively traversed by a charge carrier in order to be transported from an origin to a destination such as between a source and a drain, for example. The separation between crystal grains determines the impact of non-crystalline regions on conductivity. For example, crystal grains separated by a distance greater than the maximum inter-grain tunneling distance for a particular semiconductor material may constitute a nonconductive pathway for charge carriers. Conductivity within a crystal grain of an organic semiconductor also depends on charge carrier energy levels and molecular overlaps in the crystal.

Since conductivity is proportional to mobility for materials with one charge carrier type, and mobility may be directly measured, the mobility is generally considered to be the most important parameter for characterization of transistors such as FETs. The On/Off ratio is generally considered to be the second most important parameter. The measurements of the FETs fabricated as reported above were performed with a Hewlett-Packard 4155A Semiconductor Parameter Analyzer in Examples 1-5, and an Agilent E5273A source meter in Examples 6-15.

The following formula was used to determine the mobility, in linear regime, of the transistors fabricated in accordance with Examples 1-5.

$$\mu = (\partial I_{ds}/\partial Vg) \cdot (L/WciV_{ds}) \quad (2)$$

In formula (2), $I_{ds}$ is the drain-source (or source-drain) current in the linear regime (|Vd|<|Vg|). Vg is the gate electrode voltage, $V_{ds}$ is the drain-source (or source-drain) voltage, $C_i$ is the gate insulator capacitance per unit area, L is the channel length, W is the channel width, and $\partial$ denotes a partial derivative. The voltages for the measurement of the output characteristics were varied in the following range: 0V≧Vds≧−60V (10 V steps), 10 V≧Vgs≧−60 V (10 V steps). The gate insulator capacitance in the FETs was directly measured by probes attached to the Hewlett-Packard inductance-capacitance-resistance meter. The W/L ratio was measured using an optical microscope.

The following formula was used to determine the mobility, in saturation regime, of the transistors fabricated in accordance with Examples 6-15. This methodology may yield mobilities having a magnitude about half as large as the methodology discussed above in connection with Examples 1-5.

$$I_{ds} = W/2L \times C_i \mu (Vg-V t)^2 \quad (3)$$

In formula (3), $I_{ds}$ is the saturation drain-source current, W is the width of the source-drain gap, L is the length of the gap, $C_i$ is the capacitance of the organic dielectric composition body, μ is the mobility in cm$^2$/Vs, $V_g$ is the gate electrode voltage and $V_t$ is the threshold voltage. An applied drain-source current within a range of between −100 volts and 0 volts at intervals of −20 volts was used in testing the transistors. In each graphed plot, the curve descending the farthest down the current (y) axis represents −100 volts; and the curves descending less down the y axis successively represent lower applied voltages, that is, −80 volts, −60 volts, −40 volts, −20 volts and 0 volts. The capacitance of the organic dielectric composition bodies in the FETs was directly measured by probes attached to a Hewlett-Packard inductance-capacitance-resistance meter with an applied current. The W/L ratio was measured by using an optical microscope.

While the present invention has been disclosed in a presently preferred context, it will be recognized that the present teachings may be adapted to a variety of contexts consistent with this disclosure and the claims that follow. For example, although specific examples of implementations have been discussed with respect to FETs, other active electronic devices may be fabricated.

We claim:

1. A process comprising the steps of:
   providing a support body;
   forming an organic semiconductor composition body including an organic semiconductor composition on said support body;
   providing an organic dielectric composition mobilized in a liquid medium, said organic semiconductor composition being insoluble in said liquid medium; and
   forming an organic dielectric composition body from said organic dielectric composition on said organic semiconductor composition body; wherein the organic semiconductor composition includes at least one member selected from a group consisting of:
   5,5'-bis(4-(4-methylpentyloxy)phenyl)-2,2'-bithiophene;
   5,5'-bis(4-(3,7-dimethyloctyloxy)phenyl)-2,2'-bithiophene;
   5,5'-bis(4-(3S,7-dimethyloctyloxy)phenyl)-2,2'-bithiophene;
   5,5'-bis(4-(2-ethylbutyloxy)phenyl)-2,2'-bithiophene;
   5,5'-bis(4-(2-methylhexyloxy)phenyl)-2,2'-bithiophene;
   5,5'-bis(4-(2-ethylhexyloxy)phenyl)-2,2'-bithiophene;
   5,5'-bis(4-(1-methylhexyloxy)phenyl)-2,2'-bithiophene;
   5,5'-bis(4-(2-methylheptyl)phenyl)-2,2'-bithiophene;
   5,5'-bis(4-(1-methyihexyl)phenyl)-2,2'-bithiophene;
   5,5'-Bis-[4-(1-ethyl-hexyloxy)-phenyl]-[2,2']bithiophenyl;
   5,5'-Bis-[4-(2-methyl-propoxy-tetrahydro-pyran)-phenoxy]-[2,2']bithiophenyl;
   3-(4-{5'-[4-(3-Hydroxy-2-methyl-propoxy)-phenyl]-[2,2']bithiophenyl-5-yl}-phenoxy)-2-methyl-propan-1-ol;
   5,5'-Bis-[4-(1-hydroxy-3-ethyl-heptyloxy)-phenyl]-[2,2'] bithiophenyl;
   6-[4-(5'-{4-[5-(1-Vinyl-allyloxycarbonyl)-pentyloxy]-phenyl}-[2,2']bithiophenyl-5-yl)-phenoxy]-hexanoic acid 1-vinyl-allyl ester;
   5,5'-Bis-[4-N-(2-ethyl-hexyl)-benzamido]-[2,2'] bithiophenyl;
   5,5'-Bis-{4-[6-(tert-butyl-diphenyl-silanyloxy)-hexyloxy]-phenyl}-[2,2']bithiophenyl; and
   5,5'-bis(4-(propoxy ethyl)phenyl)-2,2'-bithiophene.

2. A process comprising the steps of:
   providing a support body;
   forming an organic dielectric composition body on said support body;
   providing an organic semiconductor composition mobilized in a liquid medium, the organic dielectric composition body being insoluble in said liquid medium; and
   forming an organic semiconductor composition body including said organic semiconductor composition on said organic dielectric composition body; wherein the organic semiconductor composition includes at least one member selected from a group consisting of:

5,5'-bis(4-(4-methylpentyloxy)phenyl)-2,2'-bithiophene;
5,5'-bis(4-(3,7-dimethyloctyloxy)phenyl)-2,2'-bithiophene;
5,5'-bis(4-(3S,7-dimethyloctyloxyl)phenyl)-2,2'-bithiophene;
5,5'-bis(4-(2-ethylbutyloxy)phenyl)-2,2'-bithiophene;
5,5'-bis(4-(2-methylhexyoxy)phenyl)-2,2'-bithiophene;
5,5'-bis(4-(2-ethylhexyloxy)phenyl)-2,2'-bithiophene;
5,5'-bis(4-(1-methylhexyloxy)phenyl)-2,2'-bithiophene;
5,5'-bis(4-(2-methylheptyl)phenyl)-2,2'-bithiophene;
5,5'-bis(4-(1-methylhexyl)phenyl)-2,2'-bithiophene;
5,5'-Bis-[4-(1-ethyl-hexyloxy)-phenyl]-[2,2']bithiophenyl;
5,5'-Bis-[4-(2-methyl-propoxy-tetrahydro-pyran)-phenoxy]-[2,2']bithiophenyl;
3-(4-{5'-[4-(3-Hydroxy-2-methyl-propoxy)-phenyl]-[2,2']bithiophenyl-5-yl}-phenoxy)-2-methyl-propan-1-ol;
5,5'-Bis-[4-(1-hydroxy-3-ethyl-heptyloxy)-phenyl]-[2,2']bithiophenyl;
6-[4-(5'-{4-[5-(1-Vinyl-allyloxvcarbonyl)-pentyloxy]-phenyl}-[2,2']bithiophenyl-5-yl)-phenoxy]-hexanoic acid 1-vinyl-allyl ester;
5,5'-Bis-[4-N-(2-ethyl-hexyl)-benzamido]-[2,2'] bithiophenyl;
5,5'-Bis-{4-[6-(tert-butyl-diphenyl-silanyloxy)-hexyloxy]-phenyl}-[2,2']bithiophenyl; and
5,5'-bis(4-(propoxy ethyl)phenyl)-2,2'-bithiophene.

3. The process of claim 1, wherein the organic semiconductor composition includes 5,5'-bis(4-(4-methylpentyloxy)phenyl)-2,2'-bithiophene.

4. The process of claim 1, wherein the organic semiconductor composition includes 5,5'-bis(4-(1-methylhexyloxy)phenyl)-2,2'-bithiophene.

5. The process of claim 1, wherein the organic semiconductor composition includes 5,5'-bis(4-(propoxy ethyl)phenyl)-2,2'-bithiophene.

6. The process of claim 1, wherein the organic semiconductor composition includes 5,5'-bis(4-(3,7-dimethyloctyloxy)phenyl)-2,2'-bithiophene; or 5,5'-bis(4-(3S,7-dimethyloctyloxy)phenyl)-2,2'-bithiophene; or their mixture.

7. The process of claim 1, wherein the organic semiconductor composition includes 5,5'-bis(4-(2-ethylbutyloxy)phenyl)-2,2'-bithiophene; or 5,5'-bis(4-(2-methylhexyloxy)phenyl)-2,2'-bithiophene; or their mixture.

8. The process of claim 1, wherein the organic semiconductor composition includes 5,5'-bis(4-(2-ethylhexyloxy)phenyl)-2,2'-bithiophene; or 5,5'-bis(4-(2-methylheptyl)phenyl)-2,2'-bithiophene; or their mixture.

9. The process of claim 1, wherein the organic semiconductor composition includes 5,5'-bis(4-(1-methylhexyl)phenyl)-2,2'-bithiophene; or 5,5'-Bis-[4-(1-ethyl-hexyloxy)-phenyl]-[2,2']bithiophenyl; or their mixture.

10. The process of claim 1, wherein the organic semiconductor composition includes 5,5'-Bis-[4-(2-methyl-propoxy-tetrahydro-pyran)-phenoxy]-[2,2']bithiophenyl; or 3-(4-{5'-[4-(3-Hydroxy-2-methyl-propoxy)-phenyl]-[2,2']bithiophenyl-5-yl}-phenoxy)-2-methyl-propan-1-ol; or their mixture.

11. The process of claim 1, wherein the organic semiconductor composition includes 5,5'-Bis-[4-(1-hydroxy-3-ethyl-heptyloxy)-phenyl]-[2,2']bithiophenyl; or 6-[4-(5'-{4-[5-(1-Vinyl-allyloxycarbonyl)-pentyloxy]-phenyl}-[2,2']bithiophenyl-5-yl)-phenoxy]-hexanoic acid 1-vinyl-allyl ester; or their mixture.

12. The process of claim 1, wherein the organic semiconductor composition includes 5,5'-Bis-[4-N-(2-ethyl-hexyl)-benzamido]-[2,2']bithiophenyl; or 5,5'-Bis-{4-[6-(tert-butyl-diphenyl-silanyloxy)-hexyloxy]-phenyl}-[2,2']bithiophenyl; or their mixture.

13. The process of claim 2, wherein the organic semiconductor composition includes 5,5'-bis(4-(4-methylpentyloxy)phenyl)-2,2'-bithiophene.

14. The process of claim 2, wherein the organic semiconductor composition includes 5,5'-bis(4-(1-methylhexyloxy)phenyl)-2,2'-bithiophene.

15. The process of claim 2, wherein the organic semiconductor composition includes 5,5'-bis(4-(propoxy ethyl)phenyl)-2,2'-bithiophene.

16. The process of claim 2, wherein the organic semiconductor composition includes 5,5'-bis(4-(3,7-dimethyloctyloxy)phenyl)-2,2'-bithiophene; or 5,5'-bis(4-(3S,7-dimethyloctyloxy)phenyl)-2,2'-bithiophene; or their mixture.

17. The process of claim 2, wherein the organic semiconductor composition includes 5,5'-bis(4-(2-ethylbutyloxy)phenyl)-2,2'-bithiophene; or 5,5'-bis(4-(2-methylhexyloxy)phenyl)-2,2'-bithiophene; or their mixture.

18. The process of claim 2, wherein the organic semiconductor composition includes 5,5'-bis(4-(2-ethylhexyloxy)phenyl)-2,2'-bithiophene; or 5,5'-bis(4-(2-methylheptyl)phenyl)-2,2'-bithiophene; or their mixture.

19. The process of claim 2, wherein the organic semiconductor composition includes 5,5'-bis(4-(1-methyihexyl)phenyl)-2,2'-bithiophene; or 5,5'-Bis-[4-(1-ethyl-hexyloxy)-phenyl]-[2,2']bithiophenyl; or their mixture.

20. The process of claim 2, wherein the organic semiconductor composition includes 5,5'-Bis-[4-(2-methyl-propoxy-tetrahydro-pyran)-phenoxy]-[2,2']bithiophenyl; or 3-(4-{5'-[4-(3-Hydroxy-2-methyl-propoxy)-phenyl]-[2,2']bithiophenyl-5-yl}-phenoxy)-2-methyl-propan-1-ol; or their mixture.

21. The process of claim 2, wherein the organic semiconductor composition includes 5,5'-Bis-[4-(1-hydroxy-3-ethyl-heptyloxy)-phenyl]-[2,2']bithiophenyl; or 6-[4-(5'-{4-[5-(1-Vinyl-allyloxycarbonyl)-pentyloxy]-phenyl}-[2,2']bithiophenyl-5-yl)-phenoxy]-hexanoic acid 1-vinyl-allyl ester; or their mixture.

22. The process of claim 2, wherein the organic semiconductor composition includes 5,5'-Bis-[4-N-(2-ethyl-hexyl)-benzamido]-[2,2']bithiophenyl; or 5,5'-Bis-{4-[6-(tert-butyl-diphenyl-silanyloxy)-hexyloxy]-phenyl}-[2,2']bithiophenyl; or their mixture.

* * * * *